United States Patent [19]
Hanawa et al.

[11] Patent Number: 5,753,044
[45] Date of Patent: May 19, 1998

[54] RF PLASMA REACTOR WITH HYBRID CONDUCTOR AND MULTI-RADIUS DOME CEILING

[75] Inventors: Hiroji Hanawa, Sunnyvale; Gerald Zheyao Yin, Cupertino; Diana X. Ma, Saratoga; Phil M. Salzman, San Jose; Peter Loewenhardt, Santa Clara; Allen Zhao, Mountain View, all of Calif.

[73] Assignee: Applied Materials, Inc., Santa Clara, Calif.

[21] Appl. No.: 389,889

[22] Filed: Feb. 15, 1995

[51] Int. Cl.$^6$ .................................................. C23C 16/00
[52] U.S. Cl. ................................. 118/723 I; 118/723 IR
[58] Field of Search .................. 156/345; 118/723 I, 118/723 IR, 723 MP; 204/298.34, 298.06

[56] References Cited

U.S. PATENT DOCUMENTS

| | | | |
|---|---|---|---|
| 4,795,529 | 1/1989 | Kawasaki et al. | 156/643 |
| 4,842,683 | 6/1989 | Cheng et al. | 156/345 |
| 4,844,775 | 7/1989 | Keeble | 156/643 |
| 4,872,947 | 10/1989 | Wang et al. | 156/643 |
| 4,948,458 | 8/1990 | Ogle | 156/643 |
| 4,990,229 | 2/1991 | Campbell et al. | 204/298.06 |
| 4,992,665 | 2/1991 | Mohl | 250/423 R |
| 5,122,251 | 6/1992 | Campbell et al. | 204/298.06 |
| 5,234,529 | 8/1993 | Johnson | 156/345 |
| 5,277,751 | 1/1994 | Ogle | 156/643 |
| 5,280,154 | 1/1994 | Cuomo et al. | 156/643 |
| 5,346,578 | 9/1994 | Benzing et al. | 156/345 |
| 5,368,710 | 11/1994 | Chen et al. | |
| 5,401,350 | 3/1995 | Patrick et al. | 156/345 |
| 5,449,432 | 9/1995 | Hanawa | 156/643 |
| 5,614,055 | 3/1997 | Fairbairn et al. | 156/345 |

FOREIGN PATENT DOCUMENTS

| | | |
|---|---|---|
| 0 379 828 A2 | 8/1990 | European Pat. Off. |
| 0 379 828 A3 | 8/1990 | European Pat. Off. |
| A-0 489 A 407 | 6/1992 | European Pat. Off. |
| 0 520 519 A1 | 12/1992 | European Pat. Off. |
| 0 552 491 A1 | 7/1993 | European Pat. Off. |
| 0 596 551 A1 | 5/1994 | European Pat. Off. |
| A-0 641 013 | 3/1995 | European Pat. Off. |
| A-0 685 873 | 12/1995 | European Pat. Off. |
| 2 231 197 | 11/1990 | United Kingdom. |
| WO 92/20833 | 11/1992 | WIPO. |

*Primary Examiner*—Jey Tsai
*Assistant Examiner*—Joni Y. Chang
*Attorney, Agent, or Firm*—Michaelson & Wallace

[57] ABSTRACT

An inductively coupled RF plasma reactor for processing semiconductor wafer includes a reactor chamber having a side wall and a ceiling, a wafer pedestal for supporting the wafer in the chamber, an RF power source, apparatus for introducing a processing gas into the reactor chamber, and a coil inductor adjacent the reactor chamber connected to the RF power source, the coil inductor including (a) a side section facing a portion of the side wall and including a bottom winding and a top winding, the top winding being at a height corresponding at least approximately to a top height of the ceiling, and (b) a top section extending radially inwardly from the top winding of the side section so as to overlie at least a substantial portion of the ceiling.

121 Claims, 11 Drawing Sheets

RF PLASMA REACTOR WITH HYBRID CONDUCTOR AND MULTI-RADIUS DOME CEILING

BACKGROUND OF THE INVENTION

1. Technical Field

The invention is related to radio frequency (R.F) inductively or capacitively coupled plasma reactors used in processing semiconductor wafers, and in particular to improvements therein for increasing the plasma ion density uniformity across the wafer surface.

2. Background Art

Inductively coupled plasma reactors are currently used to perform various processes on semiconductor wafers including metal etching, dielectric etching and chemical vapor deposition, as some examples. In an etch process, one advantage of an inductively coupled plasma is that a high density plasma ion density is provided to permit a large etch rate with a minimal plasma D.C. bias, thereby permitting more control of the plasma D.C. bias to reduce device damage. For this purpose, the source power applied to the antenna and the DC bias power applied to the wafer pedestal are separately controlled RF supplies. Separating the bias and source power supplies facilitates independent control of ion density and ion energy, in accordance with well-known techniques. To produce an inductively coupled plasma, the antenna is a coil inductor adjacent the chamber, the coil inductor being connected to the RF source power supply. The coil inductor provides the RF power which ignites and sustains the plasma. The geometry of the coil inductor can in large part determine spatial distribution of the plasma ion density within the reactor chamber.

One problem with such a plasma reactor is that the spatial distribution of the plasma ion density across the wafer surface is often non-uniform. This is a problem in a metal etch process, for example, because the etch rate is affected by plasma ion density, and therefore the etch rate is non-uniform across the wafer. As a result, the etch process is difficult to control and over-etches devices on some portions of the wafer and under-etches devices on other portions of the wafer, leading to reduced production yield.

One of the causes of non-uniform plasma ion distribution is the coil geometry and location. Another cause is the shape of the plasma itself, which is largely determined by the shape of the reactor chamber, particularly the reactor chamber ceiling.

Generally, the coil inductor of an inductively coupled plasma reactor is wrapped around the reactor chamber, although it does not necessarily conform to the shape of the reactor chamber walls. Necessarily, different regions of the wafer surface are displaced from the nearest coil windings by different distances and therefore experience different plasma ion densities.

Depending upon the shape of the reactor chamber ceiling, more plasma volume is located over the wafer center and less over the wafer edges, particularly in the case of a conical or hemispherical ceiling, for example. Accordingly, there tends to be inherent spatial non-uniformities in the ion flux density.

A different approach is disclosed in U.S. Pat. No. 4,948,458 to James Ogle in which a plasma reactor has a flat ceiling and a flat coil antenna overlying the ceiling. However, this approach has generally been found to provide no improvement in plasma ion density uniformity and moreover suffers from relatively large capacitive coupling in the plasma, hindering control of the plasma ion energy. A modification of that approach is disclosed in U.S. Pat. No. 5,368,710 to Chen et al., in which an attempt is made to adjust the plasma characteristics such as density by increasing the thickness of the dielectric chamber cover toward the center of the chamber. However, no versatile flexible way of adjusting plasma characteristics is facilitated with such a technique.

U.S. Pat. No. 5,346,578 assigned tio Novellus discloses a reactor having an arcuate ceiling. However, no versatile flexible way of adjusting plasma characteristics is facilitated with such a technique.

Thus, there is a need for a plasma reactor which permits flexible versatile adjustment of plasma characteristics to optimize uniformity of plasma ion density distribution.

SUMMARY OF THE INVENTION

The invention is embodied in an inductively coupled RF plasma reactor for processing a semiconductor wafer, the reactor including a reactor chamber having a side wall and a ceiling, a wafer pedestal for supporting the wafer in the chamber, an RF power source, apparatus for introducing a processing gas into the reactor chamber, and a coil inductor adjacent the reactor chamber connected to the RF power source, the coil inductor including (a) a side section facing a portion of the side wall and including a bottom winding and a top winding, the top winding being at a height corresponding at least approximately to a top height of the ceiling, and (b) a top section extending radially inwardly from the top winding of the side section so as to overlie at least a substantial portion of the ceiling preferably, the ceiling includes a dome-shaped ceiling which can be a multi-radius dome-shaped having a minimum radius of curvature near a periphery of the ceiling and maximum radius of curvature near an apex of the ceiling. Preferably, the top section is a flat disk-shaped coil while the side section is ether a cylindrically-shaped coil, truncated conically-shaped coil whose radius decreases from bottom to top or a curved-shaped winding whose radius decreases from bottom to top. In one embodiment, the side section and the top section are formed as a single continuous coiled conductor. In another embodiment, the top section and the side section are separate windings and wherein the RF power source includes a pair of independent RF power sources, each of the independent RF power sources being connected to a respective one of the top section and the side section so as to enable independent control of RF power in each one of the top section and the side section.

DETAILED DESCRIPTION OF THE PREFERRED EMBODIMENTS

The preferred embodiments of the invention described herein make reference to a plasma power source employing a conductor connected to an RF power source and overlying the plasma chamber ceiling, the conductor preferably being a coiled inductor or antenna, for example, of particular shapes and ranges of shapes. However, the invention also may be implemented using a plasma power source employing a conductor which is a capacitive electrode of the same particular shapes and ranges of shapes, the coil windings being replaced by a single integral conductive film as the capacitive electrode. In either case, the conductor (i.e., the coil windings or the integral conductive film) defines or conforms to a three dimensional surface or shape lying within a range of shapes to be described below, such as a truncated cone, a cylinder, a dome and a multi-radius dome, for example.

The present invention enables the sculpting or adjusting the shape of the plasma ion density by varying the shape of either or both the conductor and the ceiling. The ceiling shape is adjusted preferably by providing a multi-radius dome-shaped ceiling and individually adjusting the different radii of the ceiling to achieve a desired ceiling shape. The multi-radius dome embodiment of the ceiling is the preferred embodiment because it has greater plasma power efficiency than any other ceiling shape including a single-radius (hemispherical) dome. For a given ceiling shape, the conductor shape is adjusted within a continuous range of shapes from a right cylinder shape at one extreme, to a shape exactly conforming with the ceiling, to either a non-arcuate shape or a right cylinder shape at the other extreme of the range, as will be described below with greater particularity.

These adjustments enable the plasma ion density to approach optimal uniformity across the wafer surface, thereby achieving optimum processing uniformity. Such adjustments affect the plasma ion density because the ion density is affected by three factors, namely ion diffusion, local ionization near the coil inductor and local recombination near surfaces such as the ceiling surface. In a reactor in which the distances between the wafer and the ceiling and between the wafer and the coil inductor are relatively short (e.g., on the order of, but not necessarily limited to, less than 30 cm and 32 cm, respectively), the latter two factors (local ionization near the coil inductor and local recombination near the ceiling surface) are significant and the present invention can be employed to good effect. Thus, changing the coil inductor shape changes the spatial profile of local ionization near the coil inductor, while changing the multi-radius ceiling shape changes the spatial profile of the local recombination at the interior ceiling surface, thus reshaping the plasma ion density.

Figure 1:
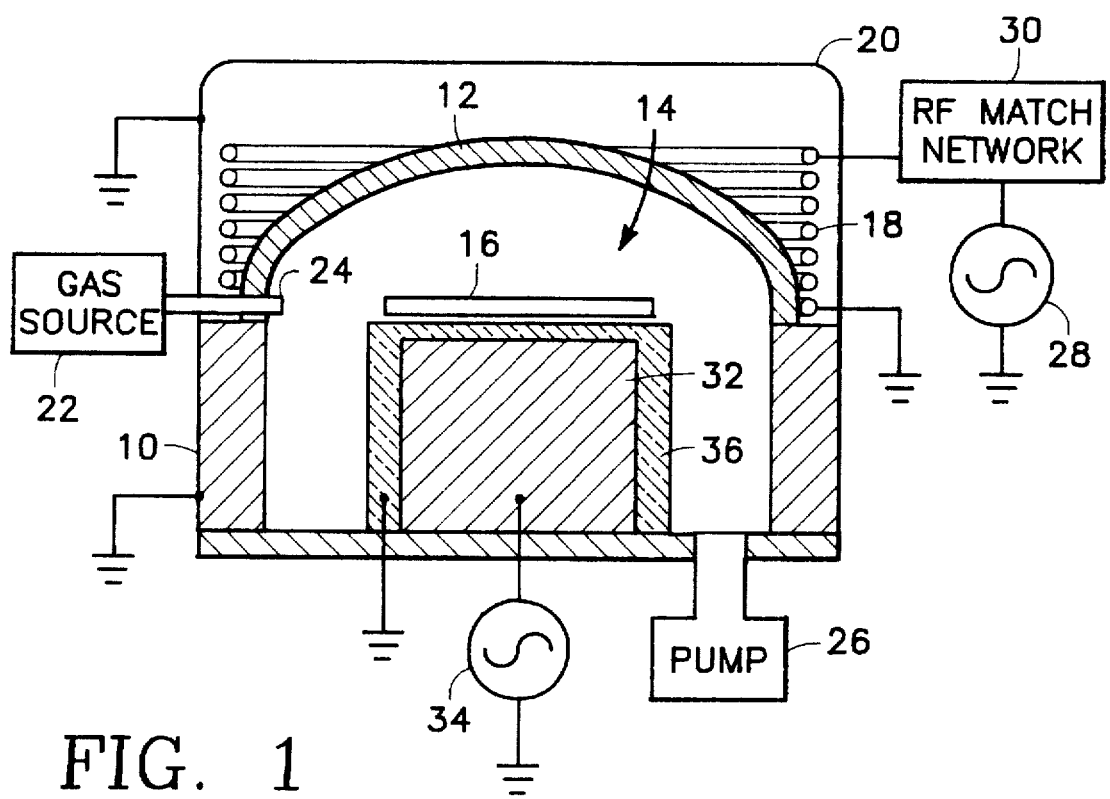
FIG. 1 is a simplified cut-away side view of an inductively coupled RF plasma reactor corresponding to a first embodiment of the invention.

Referring to FIG. 1, an inductively coupled RF plasma reactor includes a reactor chamber having a grounded conductive cylindrical sidewall 10 and a dielectric ceiling 12, the reactor including a wafer pedestal 14 for supporting a semiconductor wafer 16 in the center of the chamber, a cylindrical inductor coil 18 surrounding an upper portion of the chamber beginning near the plane of the top of the wafer or wafer pedestal 14 and extending upwardly therefrom toward the top of the chamber, a processing gas source 22 and gas inlet 24 for furnishing a processing gas into the chamber interior and a pump 26 for controlling the chamber pressure. The coil inductor 18 is energized by a plasma source power supply or RF generator 28 through a conventional active RF match network 30, the top winding of the coil inductor 18 being "hot" and the bottom winding being grounded. The wafer pedestal 14 includes an interior conductive portion 32 connected to a bias RF power supply or generator 34 and an exterior grounded conductor 36 (insulated from the interior conductive portion 32). A conductive grounded RF shield 20 surrounds the coil inductor 18.

In accordance with one aspect of the invention, uniformity of the plasma density spatial distribution across the wafer is improved (relative to conical or hemispherical ceilings) by shaping the ceiling 12 in a multi-radius dome and individually determining or adjusting each one of the multiple radii of the ceiling 12. The multiple-radius dome shape in the particular embodiment of FIG. 1 somewhat flattens the curvature of the dome ceiling 12 around the center portion of the dome, the peripheral portion of the dome having a steeper curvature. The multiple-radius dome ceiling of FIG. 1 has two radii, namely a 15 inch (37.5 cm) radius R at the top and a 3.5 inch (8.75 cm) radius r at the corner. In another embodiment, the top radius R is 13 inch(es (32.5 cm) while the corner radius r is 4 inches (10 cm).

In accordance with one feature of the invention, there is an approximately 10 cm (4 in.) space or horizontal distance between the circumferential edge of the wafer 16 and the inner surface of the dome 12 intersected by the plane of tae wafer surface. This assures uniform plasma processing of the wafer substantially free of edge effects. Depending upon application, this space may lie in the range of about 8 cm to 15 cm, but is not necessarily limited thereto.

Figure 2:
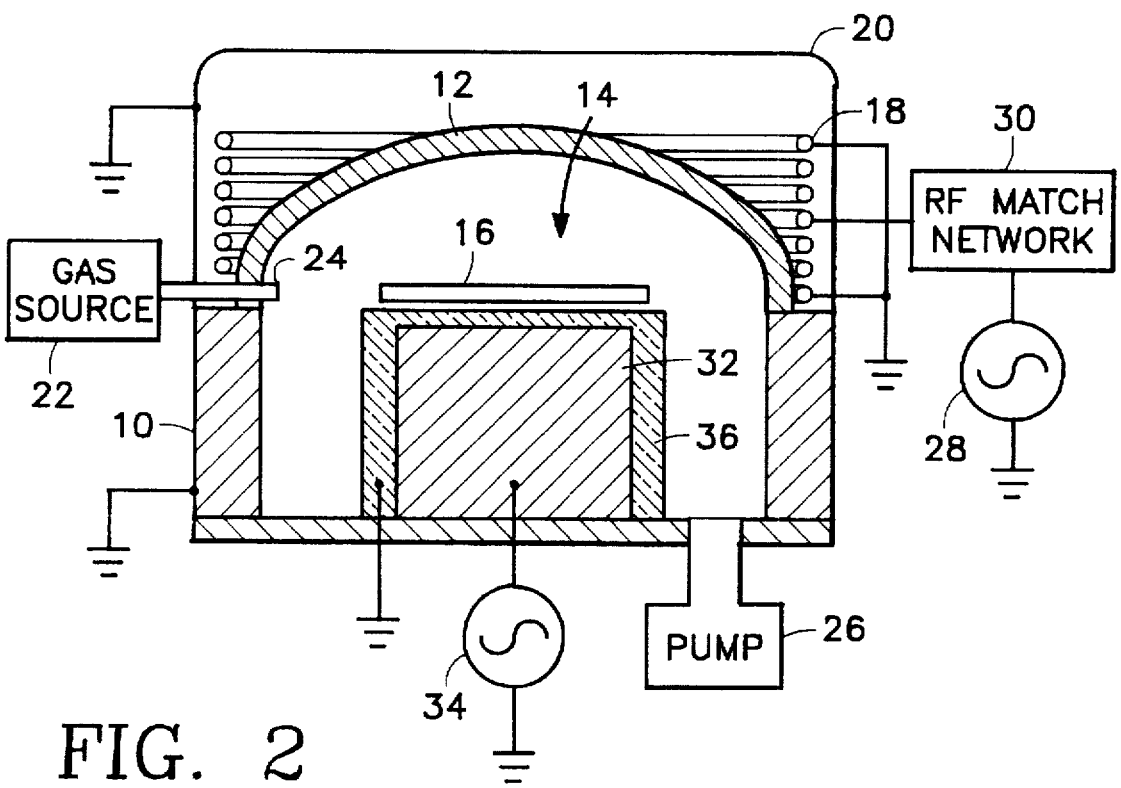
FIG. 2 is a simplified cut-away side view of an inductively coupled RF plasma reactor corresponding to a second embodiment of the invention.

As illustrated in FIG. 2, the coil inductor 18 may be coupled to the RF power source 28, 30 in a mirror coil configuration disclosed in co-pending U.S. application Ser. No. 08/277,531 filed Jul. 18, 1994 by Gerald Yin et al., entitled "PLASMA REACTOR WITH MULTI-SECTION RF COIL AND ISOLATED CONDUCTING LID" and assigned to the present assignee. In the mirror coil configuration of FIG. 2, the RF source 28, 30 is connected to the center winding of the coil inductor 18 while the top and bottom ends of the coil inductor are both grounded. As described in the above-referenced application by Gerald Yin et al., the mirror coil configuration has the advantage of reducing the maximum potential on the coil.

Figure 3:
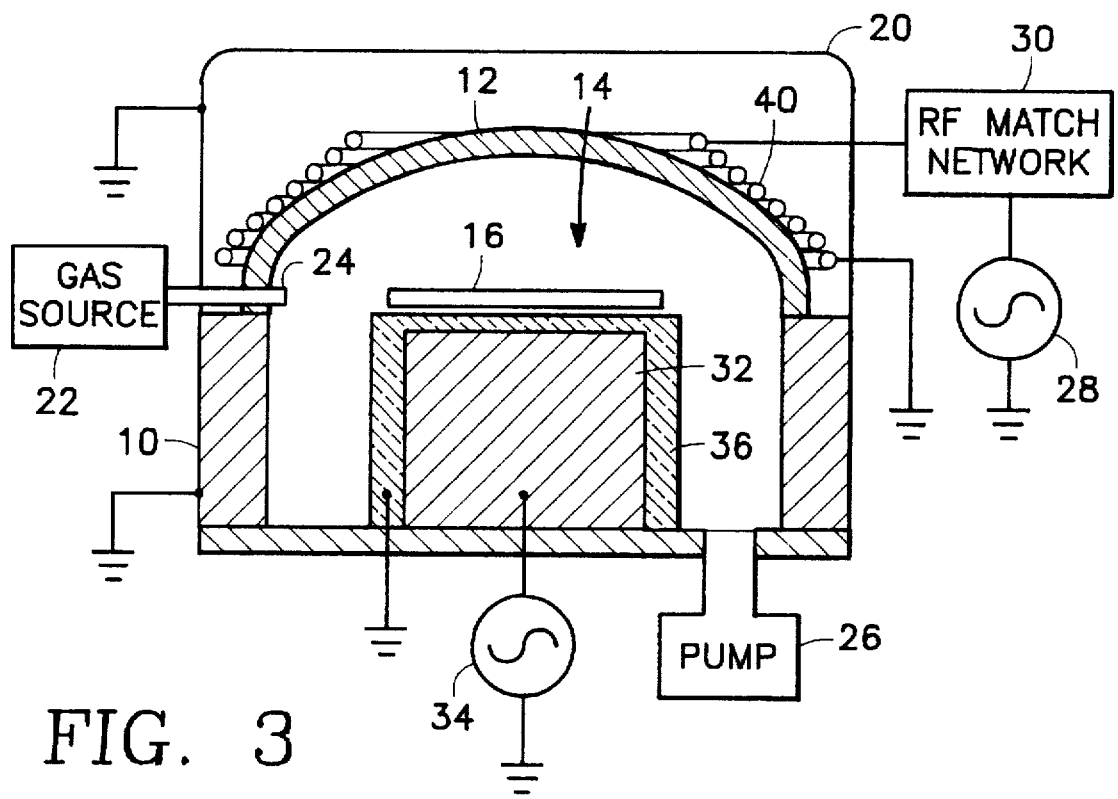
FIG. 3 is a simplified cut-away side view of an inductively coupled RF plasma reactor corresponding to a third embodiment of the invention.
Figure 4:
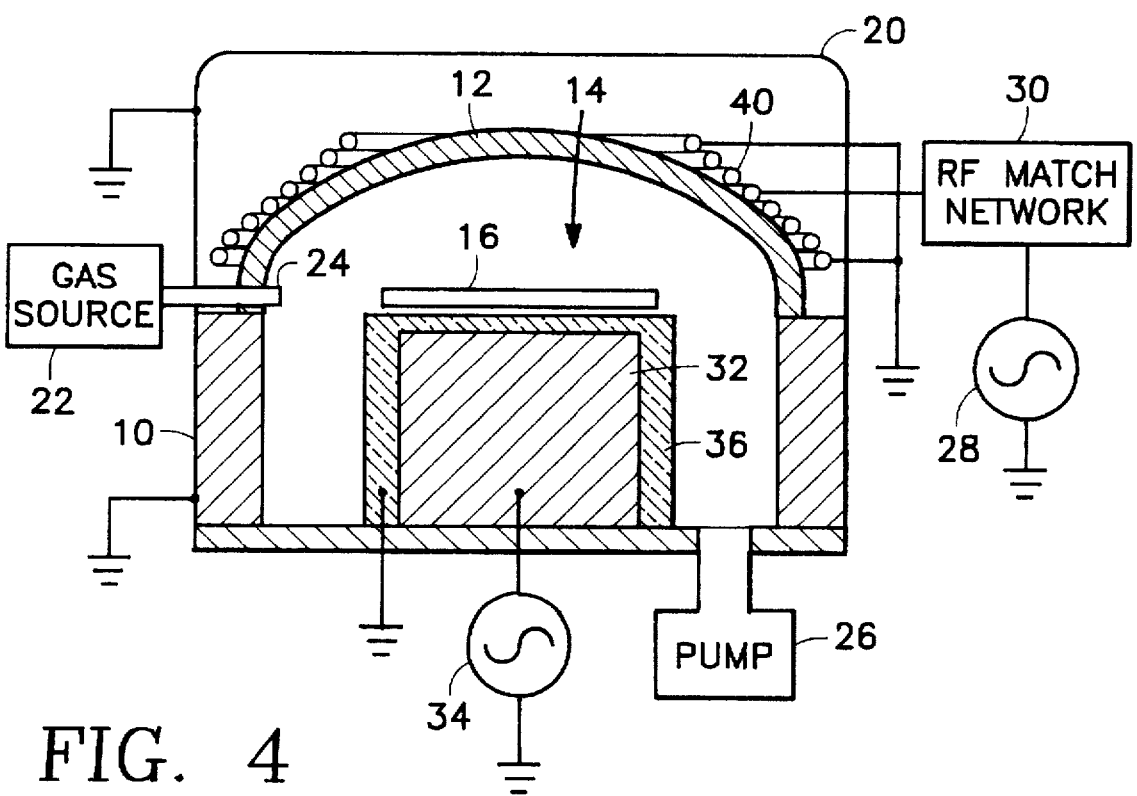
FIG. 4 is a simplified cut-away side view of an inductively coupled RF plasma reactor corresponding to a fourth embodiment of the invention.

The plasma density distribution may be varied from that obtained in the embodiment of FIG. 1 by providing a partial conical coil inductor 40 as illustrated in FIG. 3, instead of the cylindrical coil inductor. The upper windings of the conical coil inductor 40 of FIG. 3 are closer to the wafer 16 than are the upper windings of the cylindrical coil inductor 18 of FIG. 1. As illustrated in FIG. 4, the conical coil inductor 40 may be coupled to the power source 28, 30 in a mirror coil configuration analogous to that described above with reference to FIG. 2.

FIG. 4 shows that the truncated conical coil inductor 40 is spaced away from the ceiling 12 near the bottom corner of the ceiling more so than other locations along the ceiling/coil interface, due to the non-conformality between the conical coil shape and the arcuate ceiling shape. This feature advantageously suppresses sputtering at the bottom corner of the ceiling 12. For this reason, in many applications a conductor (coil inductor or capacitive electrode) which is nonconformal with the shape of the ceiling is preferred.

Figure 5:
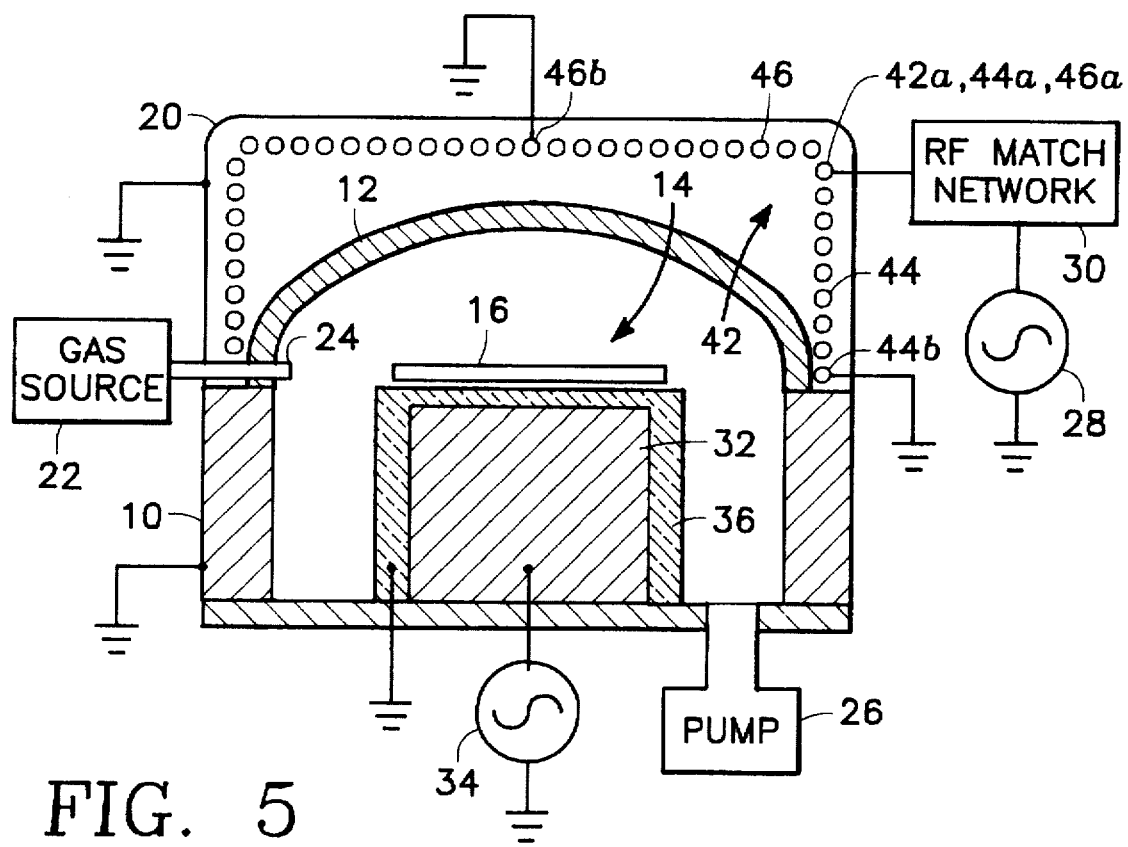
FIG. 5 is a simplified cut-away side view of an inductively coupled RF plasma reactor corresponding to a fifth embodiment of the invention.
Figure 6:
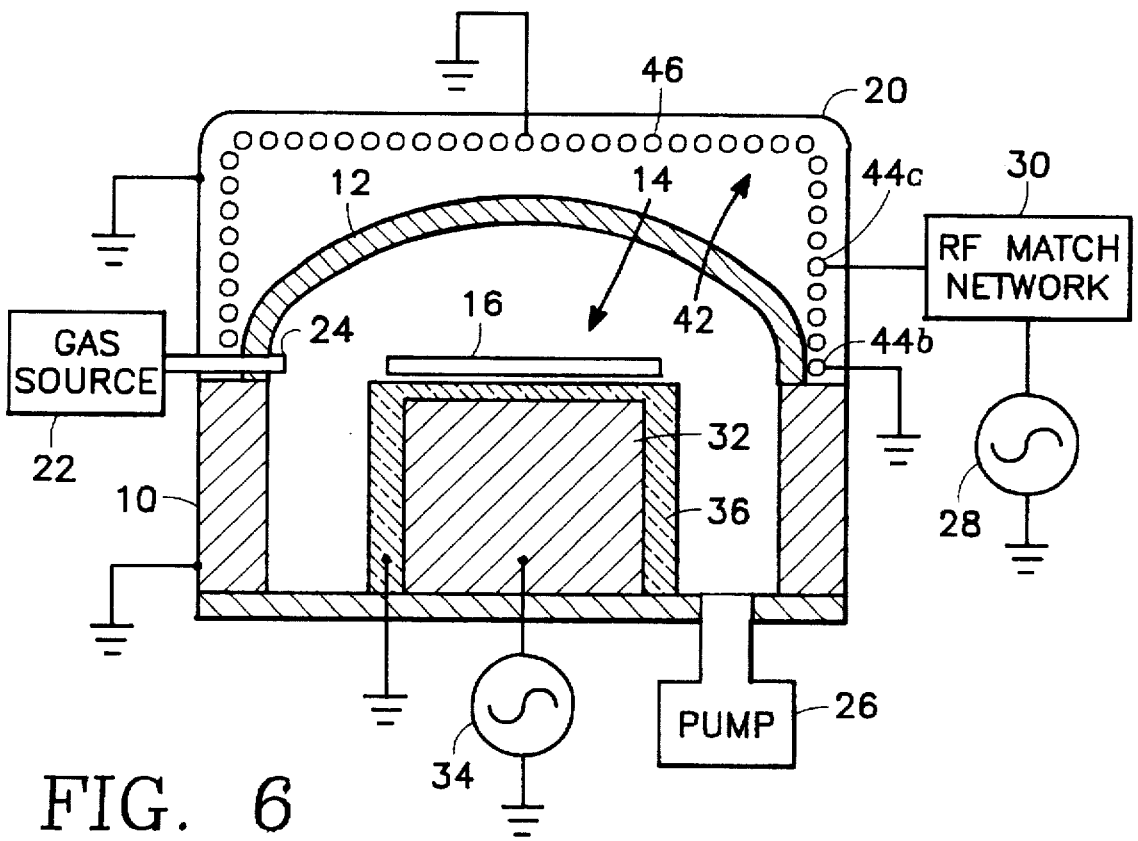
FIG. 6 is a simplified cut-away side view of an inductively coupled RF plasma reactor corresponding to a sixth embodiment of the invention.
Figure 7:
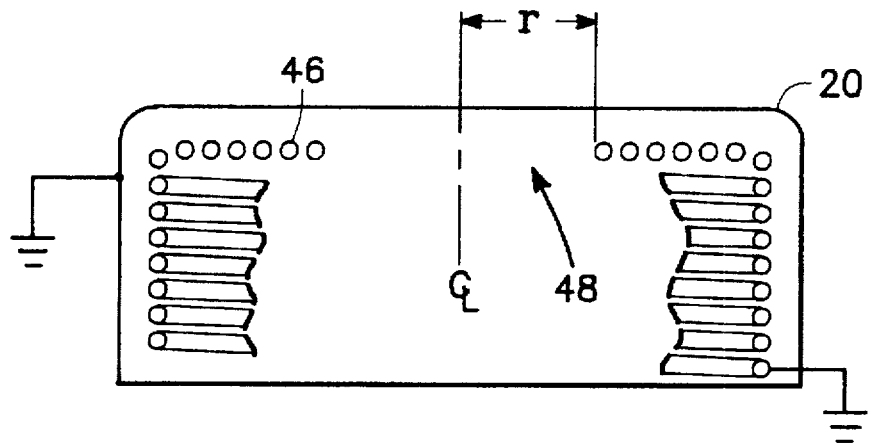
FIG. 7 is a simplified cut-away side view of an inductively coupled RF plasma reactor corresponding to a seventh embodiment of the invention.

FIG. 5 illustrates a first embodiment of the hybrid coil inductor 42 of the invention. The hybrid coil inductor 42 preferably is wound continuously from the same conductor as a unitary coil having a cylindrically shaped portion 44 and terminating in a shallow top portion 46. The cylindrically shaped portion 44 is generally configured in a manner similar to the inductor 18 of FIG. 1. The entire coil inductor 42 is energized by the same power source 28, 30. The embodiment of FIG. 5 is coupled to the power source 28, 30 in the same manner as the embodiment of FIG. 1 in which the top winding 42a is RF "hot" while the bottom winding 42b is grounded. Moreover, the top winding 42a of the hybrid coil inductor 42 is both the top winding 44a of the cylindrical portion 44 as well as being the outermost winding 46a of the shallow top portion 46. The end of the innermost winding 46b of the top portion 46 is also grounded as shown in FIG. 5. FIG. 6 illustrates how the embodiment of FIG. 5 may be modified by moving the connection of the power source 28, 30 to a winding other than the top winding 42a, such as the middle winding 44c of the cylindrical portion 44. FIG. 7 illustrates a modification in which the shallow top portion 46 has an empty space or opening 48 of inner radius r. This inner opening can compensate for the tendency of the top portion 46 to provide a higher plasma ion density at the wafer center, so that the embodiment of FIG. 7 provides a more uniform plasma ion density with the opening 48 than the embodiments of FIG. 5 or 6 in general.

Figure 8:
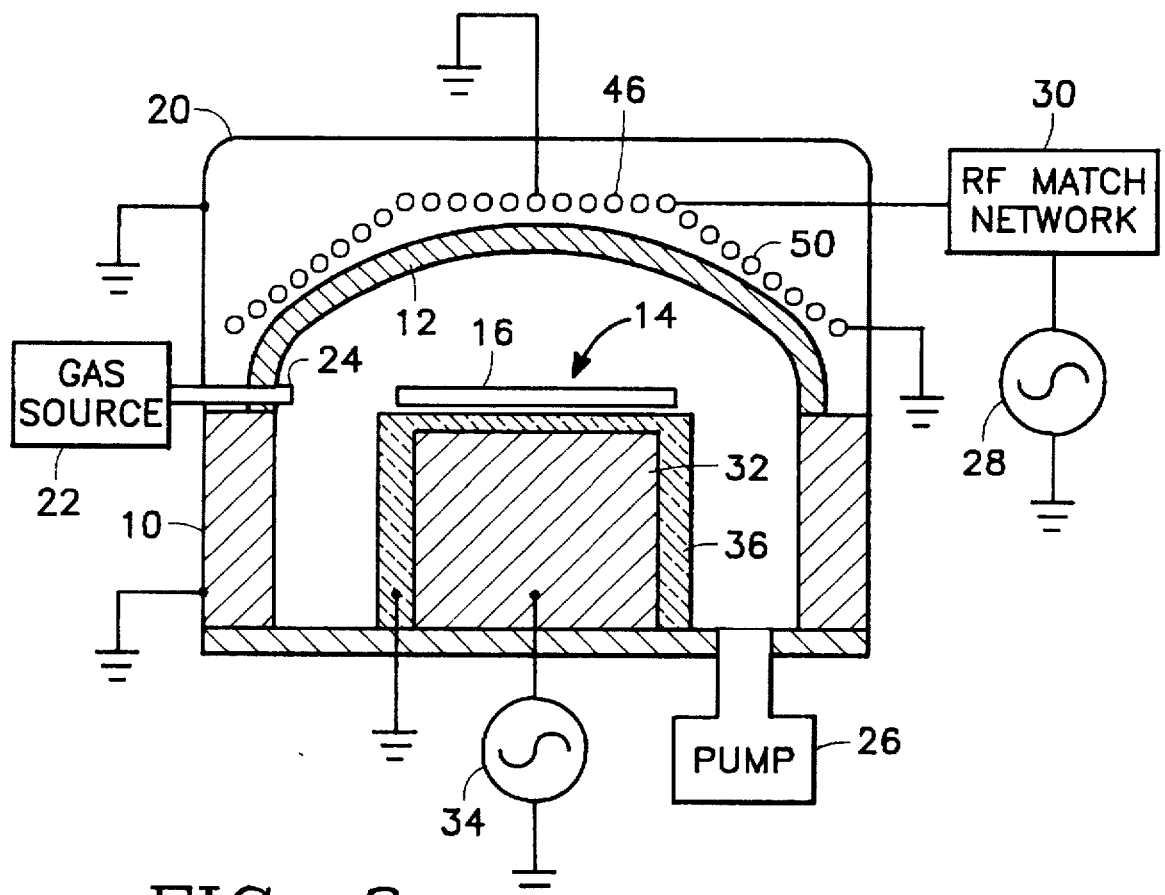
FIG. 8 is a simplified cut-away side view of an inductively coupled RF plasma reactor corresponding to a eighth embodiment of the invention.
Figure 9:
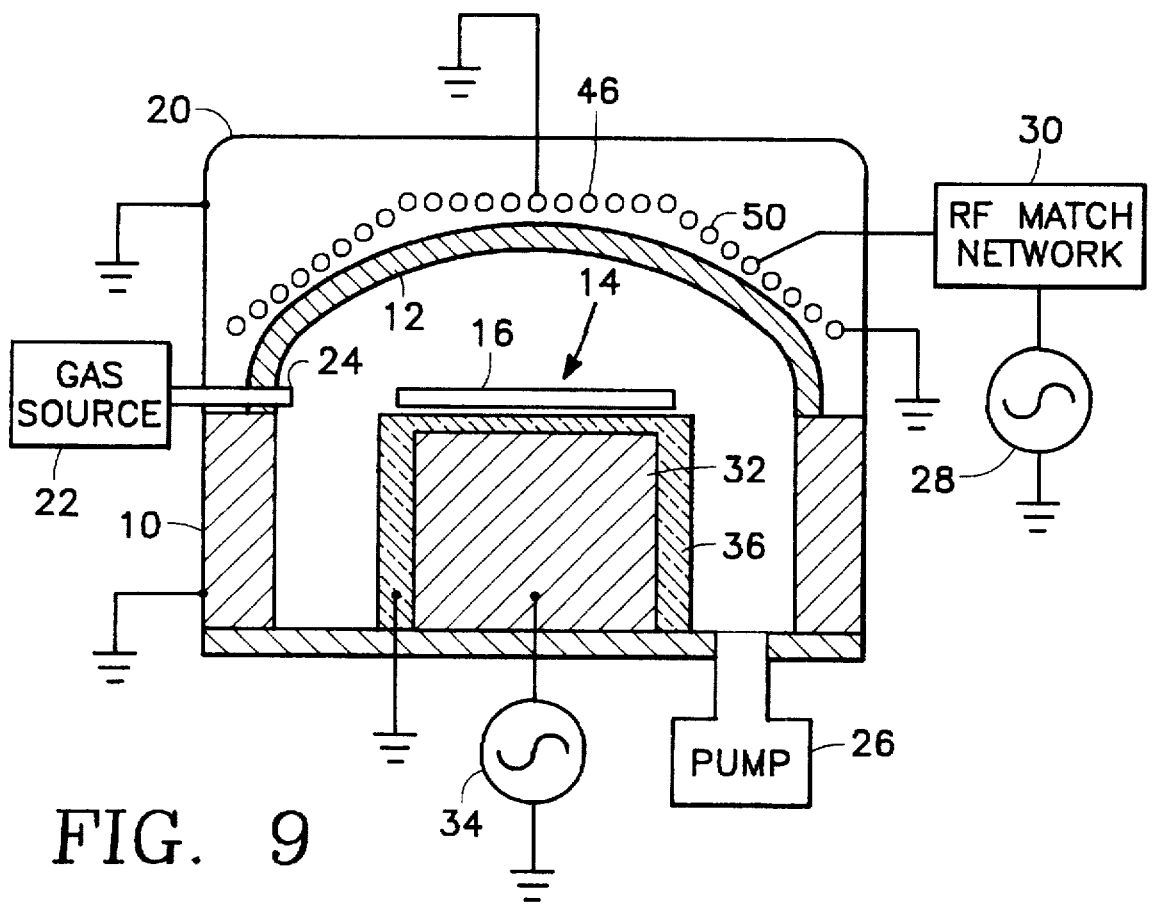
FIG. 9 is a simplified cut-away side view of an inductively coupled RF plasma reactor corresponding to a ninth embodiment of the invention.
Figure 10:
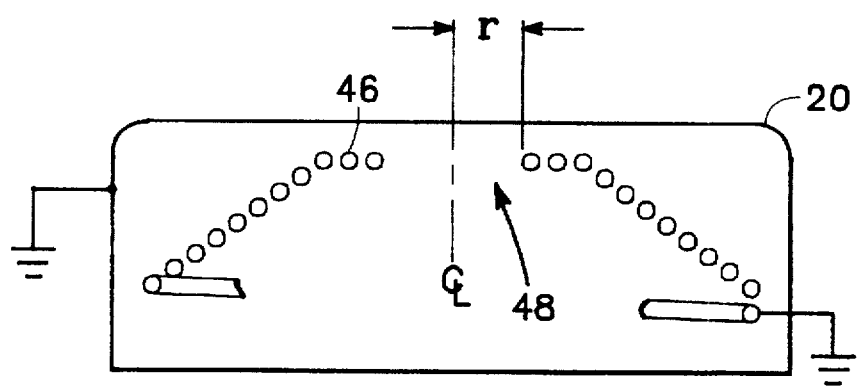
FIG. 10 is a simplified cut-away side view of an inductively coupled RF plasma reactor corresponding to a tenth embodiment of the invention.

FIG. 8 illustrates a second embodiment of the hybrid inductor consisting of the shallow top portion 46 and a conical side coil 50 corresponding to the conical coil inductor 40 of FIG. 3 in lieu of the cylindrical portion 44 of FIG. 5. As in the embodiment of FIG. 5, both portions 46, 50 of the coil are wound from the same continuous conductor and a single power source 28, 30 connected to the top winding 50a energizes the whole coil inductor. FIG. 9 illustrates how the power source 28, 30 may be connected to a winding other than the top winding 50a, as in FIG. 6. FIG. 10 illustrates how a center opening 48 may be provided in the top coil portion 46 in combination with the conical side coil 50.

Figure 11:
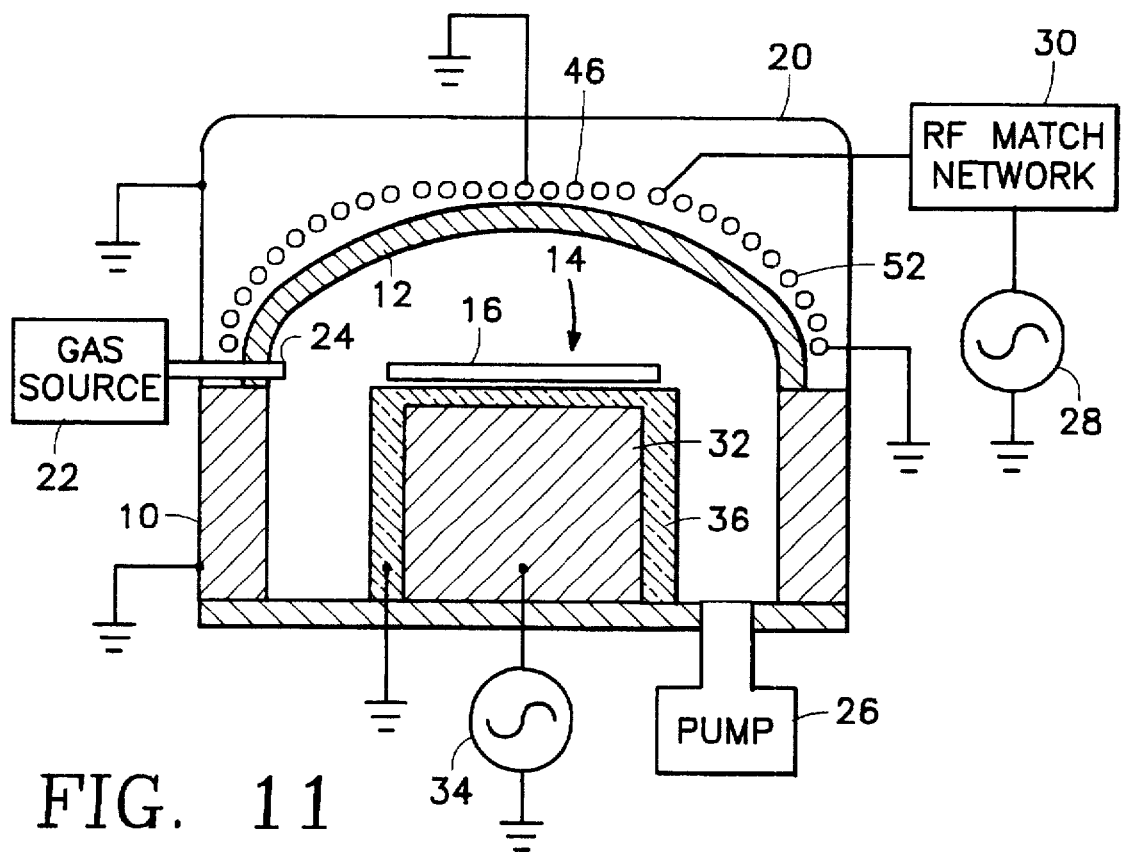
FIG. 11 is a simplified cut-away side view of an inductively coupled RF plasma reactor corresponding to an eleventh embodiment of the invention.

FIG. 11 illustrates a third embodiment of the hybrid coil inductor of the invention in which the cylindrical side portion 44 or the conical side coil 50 are replaced by a curved-section (e.g., dome) shaped coil 52, with the power source 28, 30 being connected to the outermost winding 46a of the top portion 46. As in FIG. 5, both coil portions 46, 52 are continuously wound from the same conductor and energized with one power source 28, 30. In FIG. 11, the center or top coil portion 46 is the most shallow while the side or bottom coil portion 52 is the steepest, the top coil portion most closely conforming with the shallow shape of the center of the multi-radius dome ceiling 12, this conformality diminishing radially away from the center. In an alterative embodiment, the entire coil inductor 46, 52 may be of exactly the same shape as the ceiling 12 for complete conformality.

Figure 12:
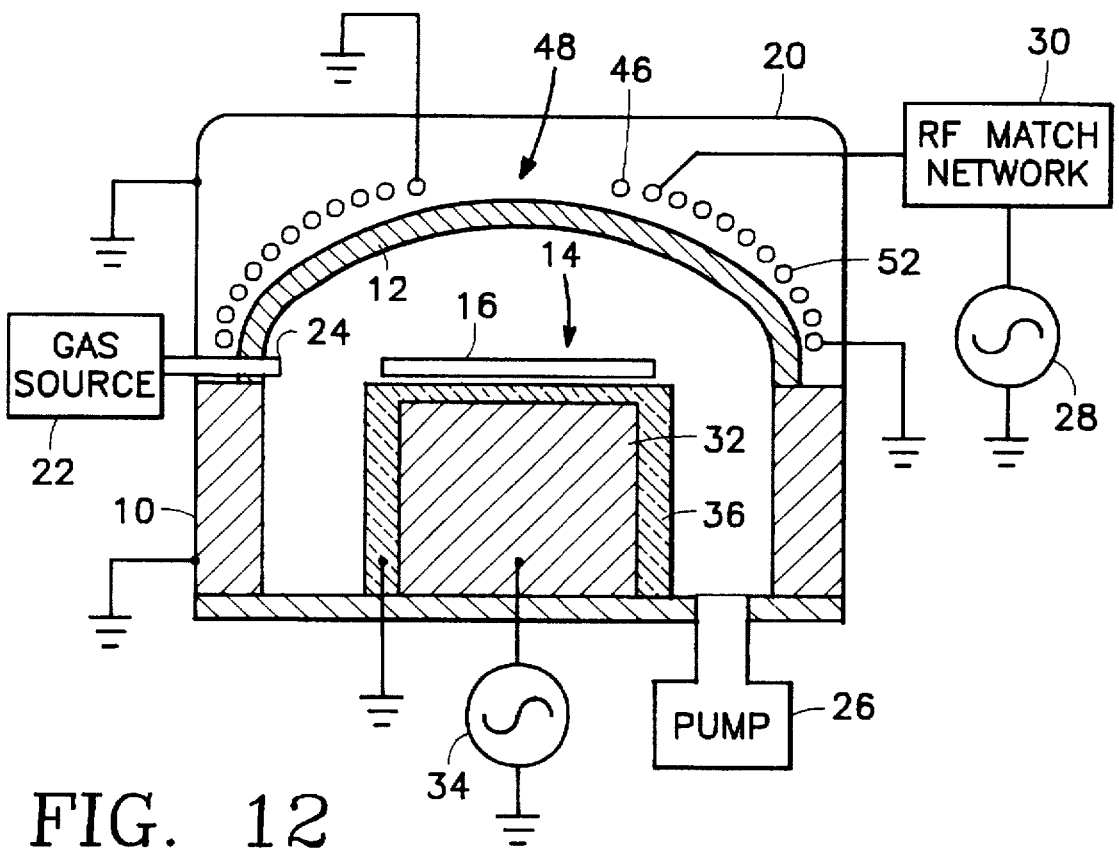
FIG. 12 is a simplified cut-away sides view of an inductively coupled RF plasma reactor corresponding to an twelfth embodiment of the invention.

FIG. 12 illustrates how the opening 48 in the top portion 46 may be combined with the curved-section side coil 52. In embodiments such as that of FIG. 12 in which the conductor (coil inductor 52 or capacitive electrode of the same shape) is at least nearly conformal with the dome ceiling, the ion current density tends to be higher near the wafer center and therefore undesirably nonuniform, provided that the highest part of the ceiling (the center) is at least 7.5 cm (3 in.) above the wafer. (A lesser height, such as 50 cm or less, causes the ion current density near the wafer center to be lower than at other portions of the wafer due to recombination effects near the ceiling.) The problem of excessive ion current density at the wafer center is solved by the aperture 48 because the aperture 48 reduces the ion current density at the wafer center to a level which is generally uniform with the ion current density around the remainder Df the wafer, depending upon the radius of the aperture 48. Preferably, for example, a 50 cm diameter chamber for processing a 30 cm diameter wafer with a nearly conformal conductor (e.g., coil inductor) as that illustrated in FIG. 12 would require the aperture 48 to be in the range of 15 cm to 25 cm in diameter in order to provide uniform ion current density across the wafer surface. As another example, a 35 cm diameter chamber for processing a 20 cm wafer would require the aperture 48 to be in the range of about 10 cm to 20 cm.

Implementations of the embodiment of FIG. 12 in which the coil inductor 52 is conformal with the ceiling 12 readily ignite the plasma. In comparison, although the non-conformal embodiments such as the conical coil inductor of FIG. 4 less readily ignite a plasma, they better suppress sputtering near the lower ceiling corner, as discussed above. Therefore, at plasma source power levels above 2000 Watts, the embodiment of FIG. 4 is preferred while at plasma source power levels below 2000 Watts the embodiment of FIG. 12 (with a ceiling-conformal coil shape and aperture) is preferred.

Figure 13:
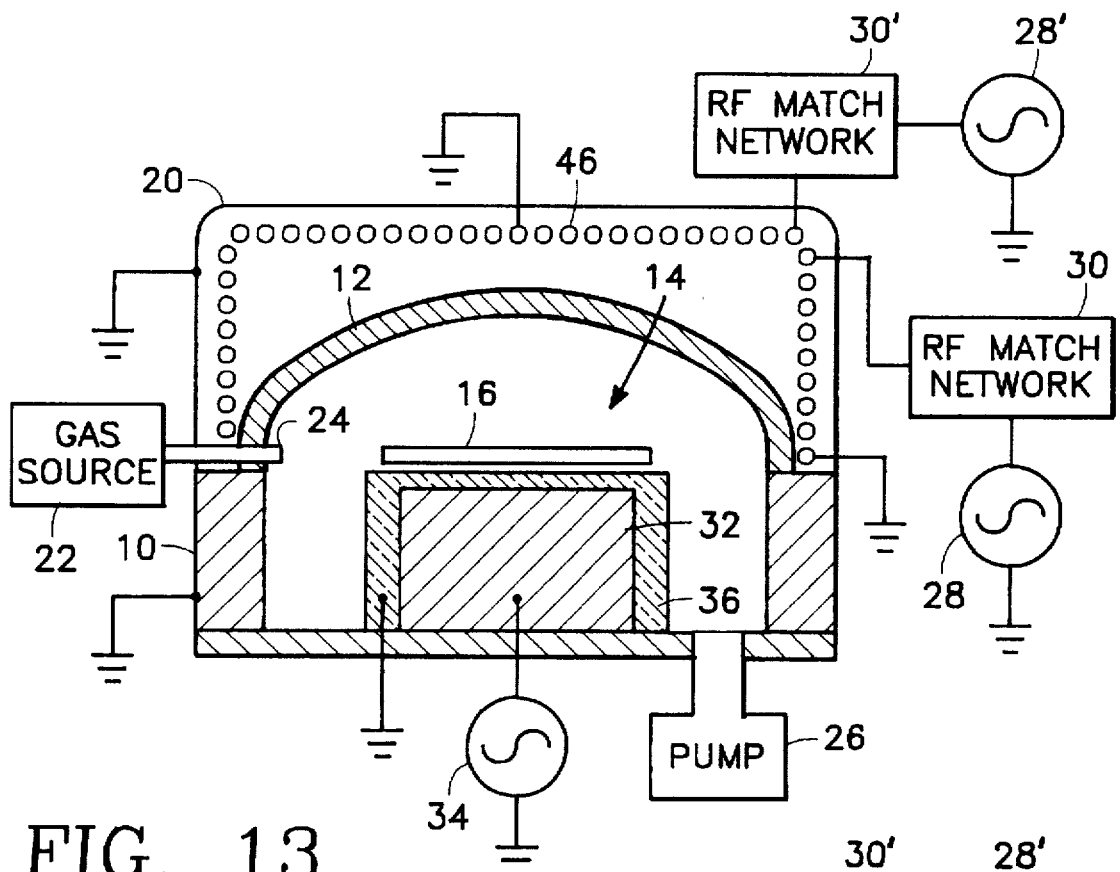
FIG. 13 is a simplified cut-away side view of an inductively coupled RF plasma reactor corresponding to an thirteenth embodiment of the invention.
Figure 14:
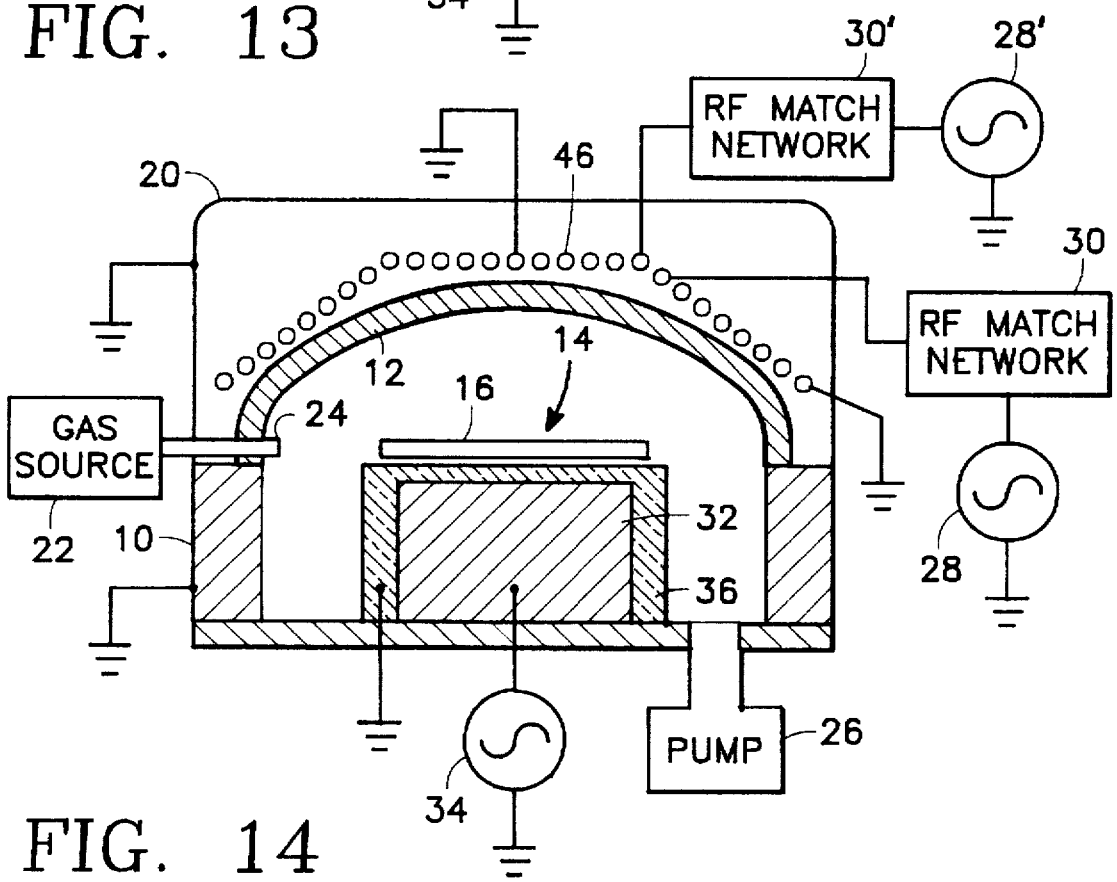
FIG. 14 is a simplified cut-away side view of an inductively coupled RF plasma reactor corresponding to an fourteenth embodiment of the invention.
Figure 15:
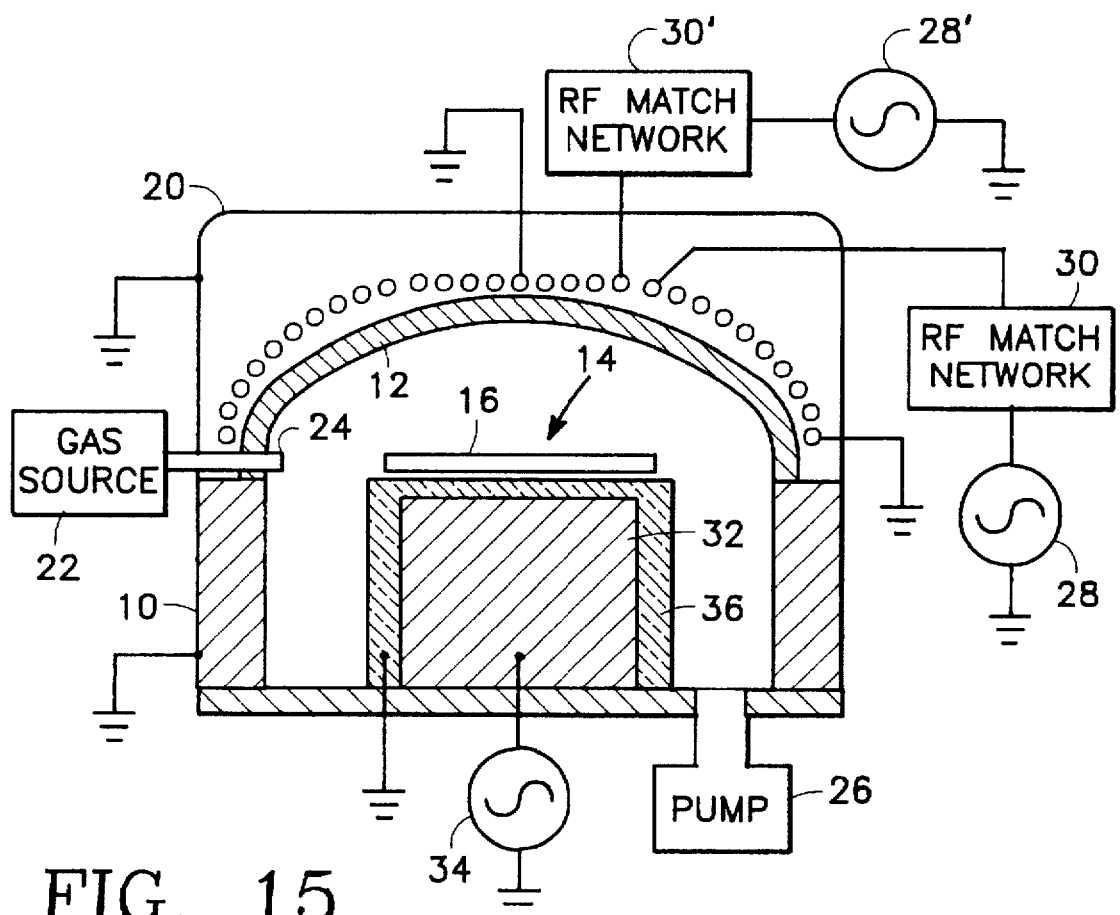
FIG. 15 is a simplified cut-away side view of an inductively coupled RF plasma reactor corresponding to an fifteenth embodiment of the invention.

FIG. 13 illustrates how the embodiment of FIG. 5 may be modified by electrically separating the portions 44, 46 of the unitary coil and energizing each coil portion 44, 46 with separately controllable independent RF power sources 28, 30 and 28', 30'. This feature has the advantage that the plasma ion density in the wafer center may be controlled relative to the plasma ion density elsewhere by changing the power output of one of the power sources 30, 30' relative to the other. FIGS. 14 and 15 illustrate how the same modification may be made to the embodiments of FIGS. 8 and 11 respectively.

The dual power supply embodiments of FIGS. 13-15 may be used to reduce, if desired, the plasma ion density at the wafer center by increasing the power to the flat top portion of the coil from RF source 28', 30' or decreasing it in the case of insufficient plasma ion density at the wafer center. Further adjustments of the power input are possible to bias the pedestal and substrate, relative to the power inputs to the coil portions.

Figure 16:
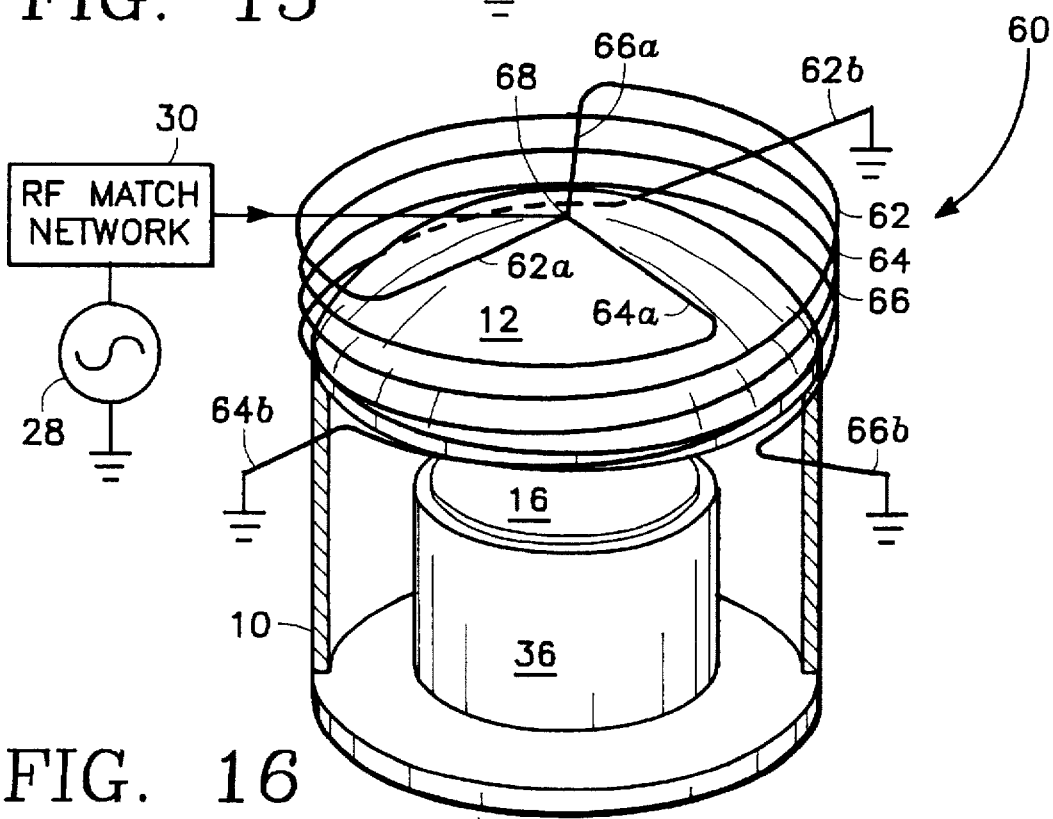
FIG. 16 illustrates an embodiment corresponding to FIG. 1 employing a coil inductor consisting of multiple concentric spiral conductors.

Referring to FIG. 16, the cylindrical coil inductor 18 of FIG. 1 may be replaced by a multiple spiral coil inductor 60 consisting of plural (e.g., three) concentric spiral conductors 62, 64, 66 connected to a common apex 68 by respective straight conductors 62a, 64a, 66a. The RF match network 30 is connected to the apex 68 while the ends 62b, 64b, 66b of the spiral conductors 62, 64, 66 are connected to ground. Preferably, the spiral conductors 62, 64, 66 are of equal lengths so that the ends 62b, 64b, 66b are equilaterally spaced about an arc. Such a multiple spiral coil inductor is disclosed in U.S. patent application Ser. No. 08/332,569 filed Oct. 31, 1994 by Xue-Yu Qian et al. entitled "INDUCTIVELY COUPLED PLASMA REACTOR WITH SYMMETRICAL PARALLEL MULTIPLE COILS HAVING A COMMON RF TERMINAL" and assigned to the present assignee.

Figure 17:
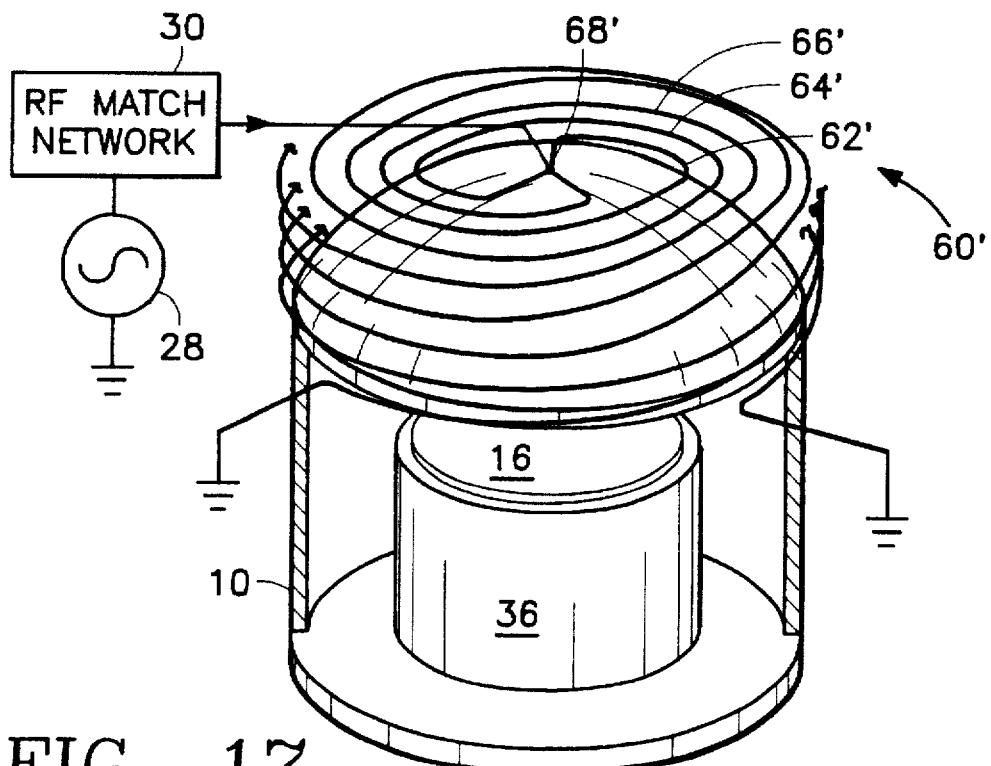
FIG. 17 illustrates an embodiment corresponding to FIG. 5 employing a coil inductor consisting of multiple concentric spiral conductors.

Referring to FIG. 17, the right-cylincter shaped coil inductor 42 of FIG. 5 may also be replaced by a multiple spiral coil inductor 60' like that of FIG. 16. In FIG. 17, the multiple spirals continue from the outer circumference of the multiple spiral coil inductor 60' to the apex 68.

Figure 18:
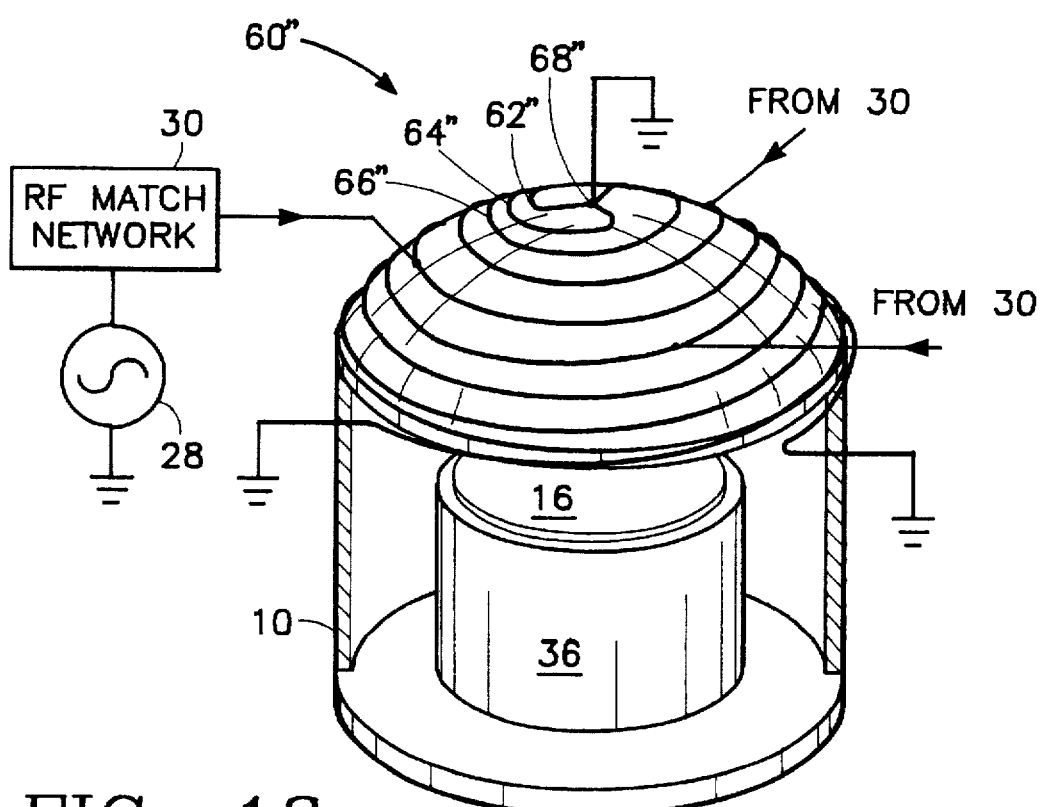
FIG. 18 illustrates an embodiment corresponding to FIG. 11 employing a coil inductor consisting of multiple concentric spiral conductors.

Referring to FIG. 18, the dome-shaped coil inductor of FIG. 11 may be replaced by a dome-shaped multiple spiral coil inductor 60" consisting of plural (e.g., three) concentric spiral conductors 62", 64", 66" connected at a common apex 68". In one variation generally applicable to multiple spiral coil inductors disclosed herein, the apex 68" and the ends of all multiple spiral conductors 62", 64", 66" are grounded while the RF match network 30 is connected to mid-points along each of the multiple spiral conductors 62", 64", 66" (similar to the mirror-coil configurations of FIGS. 2, 4, 6, 8, 9 and 11, for example). This divides each multiple spiral conductor 62", 64", 66" into two sections, although the number of sections may be greater than two. For two sections, the sections are mirror coils. For this purpose, adjacent sections are oppositely wound (wound in opposite directions) so that the magnetic fields from all sections add constructively, as described in both the above referenced applications by Yen et al. and by Qian et al. This illustrates how any embodiment employing multiple spiral coil inductors may be modified in accordance with a mirror coil configuration to provide multiple coil sections, as described in detail in the above-referenced application by Xue-Yu Qian et al.

Figure 19:
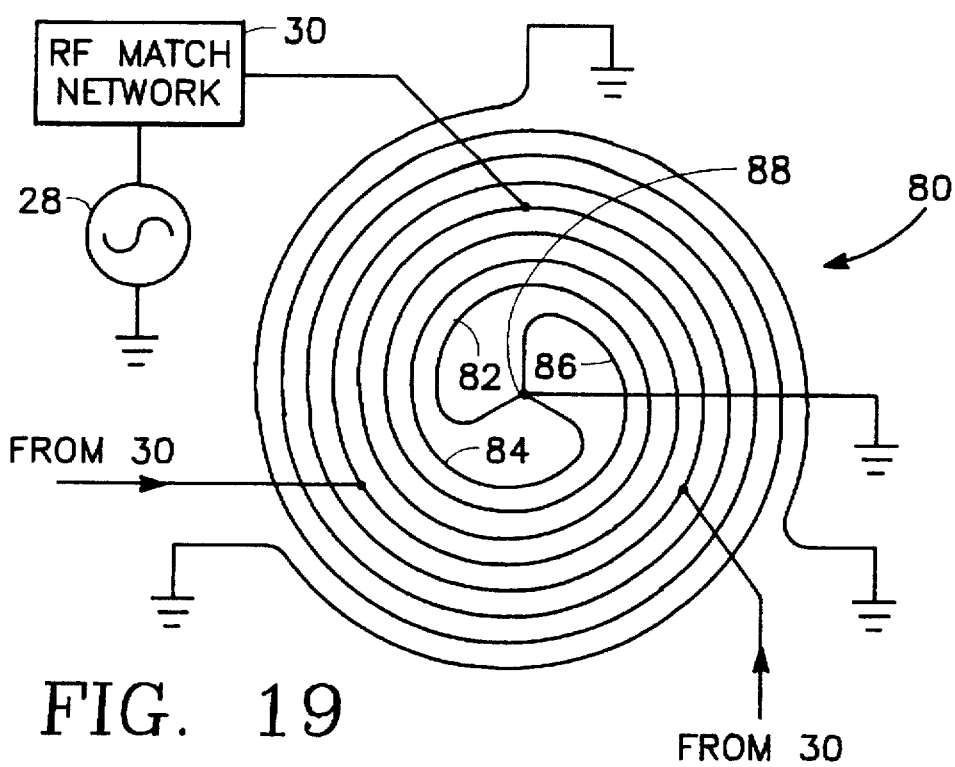
FIG. 19 illustrates an embodiment corresponding to FIG. 14 employing a coil inductor consisting of multiple concentric spiral conductors.
Figure 20:
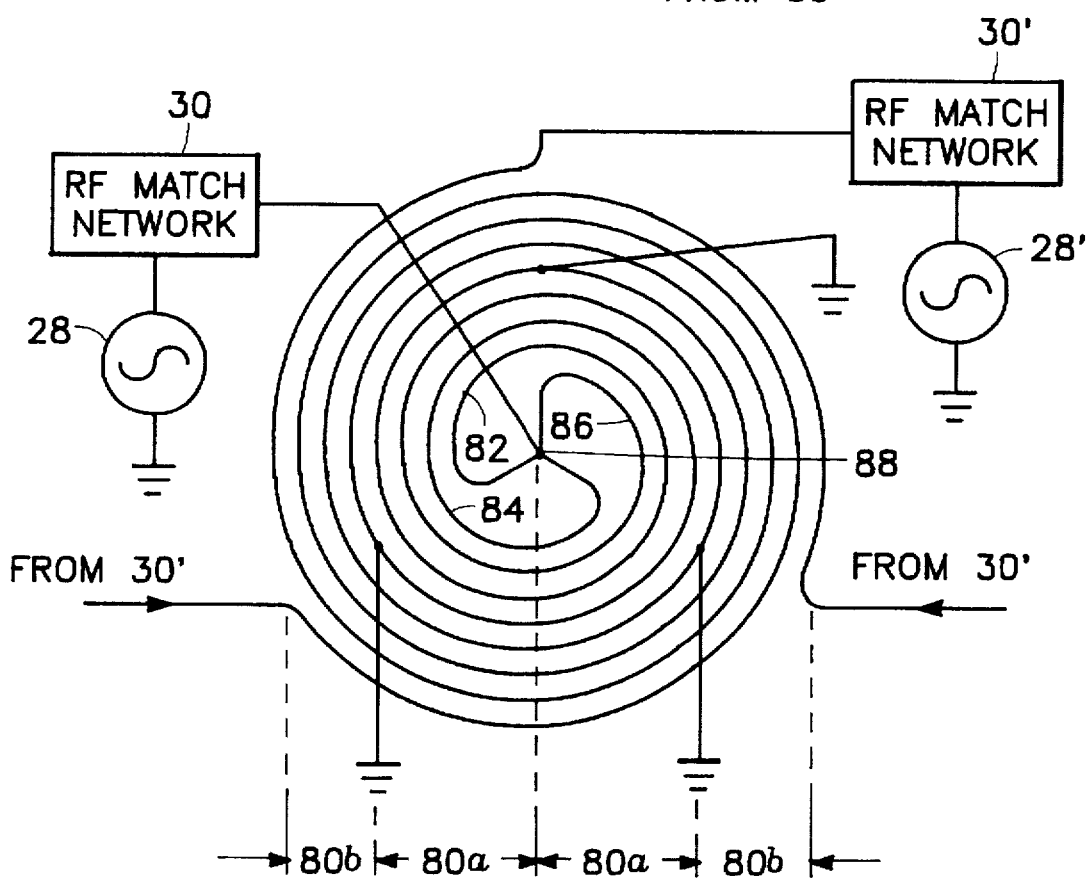
FIG. 20 illustrates a modification of the embodiment of FIG. 19 in which different portions of the inductor are powered independently.

Referring to FIG. 19, the truncated (onical coil inductor 46 of FIG. 14 may be replaced by a multiple spiral coil inductor 80 of the same shape consisting of plural (e.g., three) concentric spiral conductors 82, 84, 86 connected at a common apex 88. Referring to FIG. 20, as yet another modification applicable to any of the multiple spiral coil inductors disclosed herein, the coil inductor 80 is divided into two separately powered sections, a top section 80a and a bottom section 80b. The two sections 80a, 80b are powered independently by separately controllable RF generators 28, 28' and RF match networks 30, 30', respectively. In yet a further modification, eliminating the upper portion 80a provides an inductor (80b) having a central aperture as in the embodiments of FIGS. 10 and 12 described previously herein. In this manner both the benefits of optimizing control over many other plasma-related factors may be obtained simultaneously.

In summary, the embodiments of FIGS. 1 through 20 generally include an arcuate-shaped non-conductive or dielectric ceiling 12 which may be a dome and preferably a multiple-radius dome supported in facing spaced overlapping relationship with the wafer pedestal 32, 36. The central portion of the ceiling 12 is centered relative to the coil inductor 18 and relative to the wafer pedestal 32, 36 and has the largest radius and the peripheral or circumferential portion of the ceiling 12 has the smallest radius, so that the central portion overlying the center of the wafer pedestal 32, 36 is the most shallow or flattest and constitutes a substantial fraction of the diameter of the ceiling 12 while the remaining peripheral portion is the steepest or most curved. Preferably, the inductor 18 is a wound coil preferably wound in a multi-radius shape as in FIG. 11 or 12, but ranging between the right cylinder shape of FIGS. 1 and 2 to the planar shape Df the top portion 46 of the coil inductors of FIGS. 5-14, the preferred conical and multi-radius shapes lying within this range. The preferred multi-radius coil inductors 52 of FIGS. 11 and 12 are either conformal with the multi-radius curvature of the ceiling 12 (as in FIG. 12) are non-conformal (as in FIG. 11). In fact, all of the embodiments except that of FIG. 12 have coil inductors whose shapes are non-conformal with the multi-radius dome-shaped ceiling 12. In general, for a non-conformal coil inductor, the inductor (e.g., the multi-radius inductor 52 of FIG. 11) has at least one zone of an intermediate radius (from the center of inductor) which is axially spaced from the ceiling 12 to a greater degree than other zones (e.g., the center portion 46) of the inductor, as is the case with the embodiments of FIGS. 5-9 and 12. In the case of the preferred multi-radius inductor 52, the central portion (e.g., the central portion 46 of FIG. 11) of the inductor is most nearly flat and is closest to the ceiling 12, and has a maximum radius of curvature at its center (46) and a minimum radius of curvature at is periphery. If there are only two radii of curvature of the multi-radius inductor, then the maximum radius of curvature extends to an intermediate portion inward from the periphery while the minimum radius of curvature extends from the periphery to the intermediate portion. Alternatively, it is desirable for there to be many radii progressing monotonically from the maximum at the center to the minimum at the periphery of the inductor. In preferred embodiments such as the embodiments of FIGS. 7, 10, 12 and 20, the inductor defines a central aperture or hole (e.g., the hole 48 of FIG. 10), which has the advantage of providing a way of sculpting the plasma density by reducing the radiated RF power at the center of the inductor. This feature is particularly, complementary to the embodiments of FIGS. 5–15 having central flat inductor portions 46.

Of the foregoing feature, each may be suitably combined with others of these features and each may be exaggerated or minimized to achieve a multi-faceted sculpting of the spatial distribution of plasma density. Specifically, many useful coil shapes for optimizing plasma density distribution will be non-conformal relative to the ceiling shape, in that an intermediate radial zone of the coil shape will be spaced away from the ceiling surface in the axial direction to a greater degree than those portions of the coil nearest the center of the ceiling (as in FIG. 11, for example). An advantage is that sputtering of the ceiling is reduced where this spacing is significant near the bottom corner of the ceiling.

Figure 21:
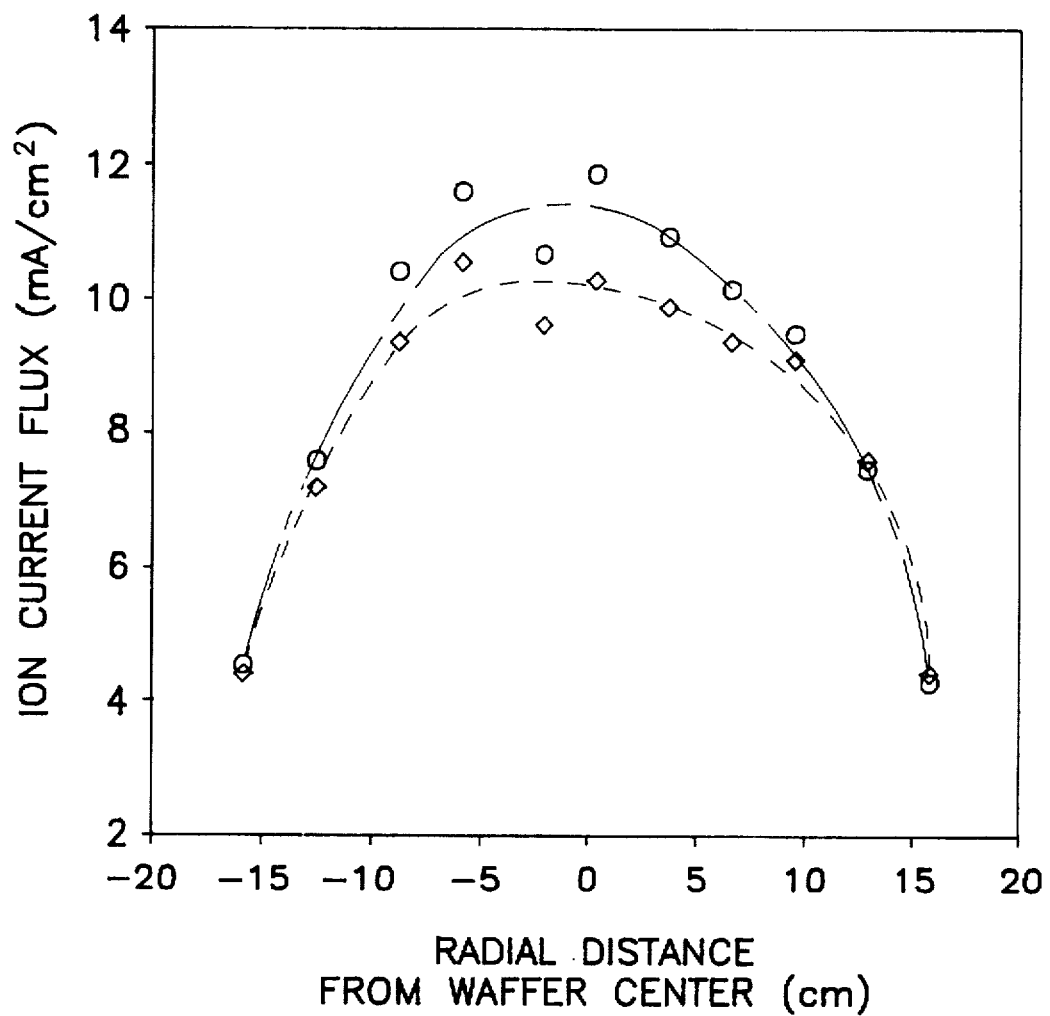
FIG. 21 is a graph of experimental data comparing the spatial distributions of plasma ion flux density for a coil inductor conformal with the dome ceiling and for a right cylinder coil inductor.

The graph of FIG. 21 illustrates how adjusting the shape of the coil inductor adjusts the plasma ion density spatial distribution. The vertical axis is the plasma ion density while the horizontal axis is the radial distances from the wafer center. The data points denoted by the empty circle symbols represent experimental data obtained with a coil inductor conforming the with the multiple radius dome ceiling. The data points denoted by solid diamonds denote experimental data obtained with a right cylinder-shaped coil inductor. The graph of FIG. 20 shows that the right cylinder-shaped coil inductor provides a flatter ion density distribution compared with that obtained with the conformal (dome-shaped) coil inductor.

With the multi-radius dome ceiling, the chamber pressure may be varied to sculpt the ion current distribution across the wafer surface. Specifically, in order to correct for excessive ion current density at the wafer center, the pressure should be increased, while the pressure should be decreased to correct inadequate ion current density at the wafer center. For example, in the case of a conformal coil as in FIG. 12 with a 10 cm quartz dome ceiling and applied plasma source power of 1500 Watts, the ideal chamber pressure is on the order of about 10 mTorr for optimizing ion current distribution uniformity.

Similarly, the applied plasma source power (e.g., from the RF source 28) may be varied to sculpt the ion current distribution across the wafer surface. Specifically, in order to correct for excessive ion current density at the wafer center, the RF power should be decreased, while the RF power should be increased to correct inadequate ion current density at the wafer center. For example, in the case of a conformal coil as in FIG. 12 with a 10 cm quartz dome ceiling and applied plasma source power of 1500 Watts, the ideal RF power level from the RF source 28 is on the order of about 1500 Watts for optimizing ion current distribution uniformity.

While the invention has been disclosed with reference to application in metal etch plasma reactors, it is also useful with plasma reactors for performing semiconductor (silicon) etch, dielectric (e.g., silicon dioxide) etch, chemical vapor deposition, physical vapor deposition and the like.

Each one of FIGS. 1–20 illustrates how the plasma reactor chamber is irradiated with plasma source RF power by a conductor overlying the chamber ceiling and having a particular shape conforming with a three dimensional surface such as a cone, cylinder or dome. While each of these figures shows how that conductor may be a coiled inductor, it should be understood that the conductor may instead be a capacitive electrode of the same shape (same three dimensional surface). In either case, the pedestal 36 is not necessarily connected to an RF bias source, and preferably is not so connected in the case in which the conductor is a capacitive electrode rather than a coil inductor.

While the invention has been described in detail by specific reference to preferred embodiments, it is understood that variations and modifications thereof may be made without departing from the true spirit and scope of the invention.

What is claimed is:

1. A plasma reactor for processing substrates, comprising:
   a pedestal to support a substrate within the reactor;
   a generally arcuately-shaped reactor wall portion of a non-conductive material supported in facing spaced overlapping relationship with the pedestal;
   said wall portion approaching a flat shape over a substantial fraction of its diameter adjacent the center of the pedestal; and
   a conductor conforming with a three dimensional surface adjacent said wall portion and capable of transmitting power into the reactor interior, said conductor having at least one zone at a radial distance from the center of said wall portion which is also spaced from said wall portion to a greater degree than other zones of said conductor.

2. A reactor as in claim 1 in which said conductor defines a central aperture of a diameter which is less than that of said reactor wall portion.

3. A reactor as in claim 1 in which said conductor approaches a flat shape adjacent the center of said reactor wall portion.

4. A reactor as in claim 1 in which said the arcuate shape of said wall portion is a multi-radius shape.

5. A reactor as in claim 1 in which said conductor is of a multi-radius shape.

6. A plasma reactor for processing substrates, comprising:
   a pedestal for supporting a substrate within the reactor;
   a generally dome-shaped reactor clover of a non-conductive material supported in facing spaced overlapping relationship with the pedestal;
   said cover approaching a flat configuration over a substantial fraction of its diameter adjacent the center of the pedestal; and
   a conductor defining with a three dimensional surface adjacent said cover and capable of transmitting power into the reactor interior, said conductor having a multi-radius shape, said shape having a maximum radius of curvature at a first radial position near the center of said dome, said shape having a minimum radius of curvature at a second radial position outwardly of said first radial position.

7. A reactor as in claim 6, in which said first radial position is spaced a first distance from said center, and said conductor extends outwardly from said dome beginning with said first distance.

8. A reactor as in claim 6, in which said shape of said conductor generally conforms to the shape of said cover.

9. A reactor as in claim 6, in which said shape of said conductor does not conform to the shape of said cover.

10. A reactor as in claim 6, in which said second radial position of said shape is positioned radially inwardly with respect to the periphery of said dome-shaped cover.

11. A reactor as in claim 6, in which said conductor is positioned adjacent said cover at said first radial position, and is spaced from said cover at said second radial position.

12. An RF plasma reactor for use with a source of RF power, and capable of confining a subatmospheric processing gas atmosphere for processing substrates, comprising:

a pedestal to support a substrate within the reactor;

a reactor cover including a non-conductive portion in facing spaced overlapping relationship to said pedestal, said non-conductive portion having a first multi-radius shape including a minimum radius of curvature adjacent the periphery of said pedestal and a maximum radius of curvature adjacent the center of said pedestal; and a conductor supported about and adjacent said non-conductive cover portion, said conductor exhibiting a second multi-radius shape including a maximum radius of curvature adjacent the center of said conductor, said conductor accepting power from a source of RF power and transmitting same into said reactor to sustain a plasma from gas within the reactor.

13. A reactor as in claim 12, in which said conductor shape and said dome shape are similar to each other.

14. A reactor as in claim 13, in which said conductor shape conforms to said dome shape.

15. A reactor as in claim 14, in which said conductor rests upon said dome.

16. A reactor as in claim 12, in which said conductor shape differs from said dome shape.

17. A reactor as in claim 12, in which said conductor shape exhibits its minimum radius of curvature inwardly of the periphery of said cover portion.

18. A reactor as in claim 12, in which said conductor shape exhibits a minimum radius of curvature adjacent the periphery of said cover portion.

19. A reactor as in claim 12, in which said conductor defines a central aperture.

20. An RF plasma reactor for processing substrates in a controlled environment, comprising:

a pedestal to support a substrate in a reactor;

an arcuately shaped reactor cover of a non-conductive material supported in facing spaced overlapping relationship with said pedestal;

a conductor of electrically conductive material supported about and adjacent said cover and defining a three dimensional surface, said conductor having a shape which is non-conformal to said reactor cover; and said conductor adapted to transmit RF power into the reactor to aid in sustaining a plasma from gas within the controlled environment.

21. A reactor as in claim 20, in which said conductor defines a multi-radius dome shape.

22. A reactor as in claim 21, in which said conductor defines a minimum radius of curvature adjacent the periphery of said conductor and a maximum radius of curvature adjacent the center of said conductor.

23. A reactor as in claim 20, in which said conductor shape defines a maximum radius of curvature adjacent the center of said conductor.

24. A reactor as in claim 20, in which said conductor shape defines its minimum radius of curvature inwardly of the periphery of said conductor.

25. A reactor as in claim 20, in which said conductor shape defines its minimum radius of curvature adjacent the periphery of said conductor.

26. A reactor as in claim 20, in which said conductor defines a central aperture.

27. A reactor as in claim 20, in which said arcuately shaped reactor cover has a multi-radius dome shape.

28. A reactor as in claim 20, in which said conductor is one of: (a) an inductive coil, and (b) a capacitive electrode.

29. An RF plasma reactor for processing substrates in a controlled processing environment, comprising:

a pedestal to support a substrate within the reactor;

a reactor chamber wall of a non-conductive material positioned in facing spaced overlapping relationship with said pedestal;

a conductor defining a three dimensional surface supported adjacent said non-conductive wall, said conductor being non-conformal in shape in relation to said non-conductive wall, and said conductor being positioned in a central overlapping relationship to said non-conductive wall and pedestal; and said conductor adapted to transmit RF power into the reactor to sustain a plasma from gas in the controlled processing environment, in which said conductor defines a central aperture.

30. A reactor as in claim 29, in which said non-conductive wall includes a dome shaped portion in facing relationship with said pedestal.

31. A reactor as in claim 29, in which said chamber wall includes a flat portion in facing relationship with said pedestal.

32. A reactor as in claim 29, in which said conductor includes a portion which is dome shaped and centered with respect to said pedestal.

33. A reactor as in claim 29, in which said conductor includes a portion which is flat and centered with respect to said pedestal.

34. A reactor as in claim 29, in which conductor is one of:
(a) an inductive coil, and (b) a capacitive electrode.

35. An inductively coupled RF plasma reactor for processing semiconductor wafer, comprising:

a reactor chamber having a side wall and a ceiling;

a wafer pedestal for supporting said wafer in said chamber;

an RF power source;

means for introducing a processing gas into said reactor chamber;

a coil inductor adjacent said reactor chamber connected to said RF power source, said coil inductor comprising:
(a) a side section facing a portion of said side wall and comprising a bottom winding and a top winding, said top winding being at a height corresponding at least approximately to a top height of said ceiling,
(b) a top section extending radially inwardly from said top winding of said side section so as to overlie at least a substantial portion of said ceiling.

36. The reactor of claim 35 wherein said ceiling comprises a dome-shaped ceiling.

37. The reactor of claim 36 wherein said dome-shaped ceiling has a multi-radius dome shaped having a minimum radius of curvature near a periphery of said ceiling and maximum radius of curvature near an apex of said ceiling.

38. The reactor of claim 35 wherein said top section is a flat disk-shaped coil.

39. The reactor of claim 38 wherein said side section is a cylindrically-shaped coil.

40. The reactor of claim 38 wherein said side section is a truncated conically-shaped coil whose radius decreases from bottom to top.

41. The reactor of claim 38 wherein said side section is a curved-shaped winding whose radius decreases from bottom to top.

42. The reactor of claim 35 wherein said top winding has an radially innermost winding, and said side section and said top section are formed as a single continuous coiled conductor having two ends, one of said ends being a termination of said bottom winding and the other of said ends being a termination of said radially innermost winding of said top section.

43. The reactor chamber of claim 42 wherein said RF power source is connected to an intermediate winding of said coil inductor between said innermost winding of said top section and said bottom winding of said side section and wherein each of said ends of said coil inductor are grounded.

44. The reactor chamber of claim 42 wherein said RF power source is connected to said top winding of said side section and wherein each of said ends of said coil inductor are grounded.

45. The reactor of claim 42 wherein said radially innermost winding of said top section has a radius comprising a substantial fraction of the radius of said top section, thereby forming an empty void at the center of said top section.

46. The reactor of claim 42 wherein said ceiling comprises a dome-shaped ceiling.

47. The reactor of claim 46 wherein said dome-shaped ceiling has a multi-radius dome shaped having a minimum radius of curvature near a periphery of said ceiling and maximum radius of curvature near an apex of said ceiling.

48. The reactor of claim 35 wherein said top section and said side section are separate windings and wherein said RF power source comprises a pair of independent RF power sources, each of said independent RF power sources being connected to a respective one of said top section and said side section so as to enable independent control of RF power in each one of said top section and said side section.

49. The reactor of claim 48 wherein said top section comprises a radially innermost winding and a radially outermost winding adjacent said top winding of said side section.

50. The reactor chamber of claim 49 wherein said radially innermost winding of said top section and said bottom winding of said side section are each grounded at their respective ends, and wherein one of said independent RF power sources is connected to said radially outermost winding of said top section at the end thereof and the other one of said independent RF power sources is connected to said top winding of said side section at the end thereof.

51. The reactor of claim 48 wherein said ceiling comprises a dome-shaped ceiling.

52. The reactor of claim 51 wherein said dome-shaped ceiling has a multi-radius dome shaped having a minimum radius of curvature near a periphery of said ceiling and maximum radius of curvature near an apex of said ceiling.

53. The reactor of claim 35, 36, 37, 38, 39, 40, 41, 42, 43, 44, 45, 46, 47, 48, 49, 50, 51 or 52 further comprising a bias RF source connected to said wafer pedestal, said bias RF source being independent of said R.F power source whereby respective RF power levels applied to said coil inductor and to said wafer pedestal are independently adjustable for independent selection of etch rate and plasma D.C. bias.

54. An inductively coupled RF plasma reactor for processing semiconductor wafer, comprising:
 a reactor chamber having a side wall and a dome-shaped ceiling, said dome-shape ceiling having a multi-radius dome shaped with a minimum radius of curvature near a periphery of said ceiling and a maximum radius of curvature near an apex of said ceiling;
 a wafer pedestal for supporting said wafer in said chamber;
 an RF power source;
 means for introducing a processing gas into said reactor chamber;
 a coil inductor adjacent said reactor chamber connected to said RF power source, said coil inductor comprising a side section facing a portion of said side wall and comprising a bottom winding and a top winding, said top winding being at a height corresponding at least approximately to a top height of said ceiling;
 a bias RF source connected to said wafer pedestal, said bias RF source being independent of said R.F power source whereby respective RF power levels applied to said coil inductor and to said wafer pedestal are independently adjustable for independent selection of etch rate and plasma D.C. bias.

55. The reactor of claim 54 wherein said side section is a cylindrically-shaped coil.

56. The reactor of claim 54 wherein said side section is a truncated conically-shaped coil whose radius decreases from bottom to top.

57. The reactor of claim 54 wherein said side section is a curved-shaped winding whose radius decreases from bottom to top.

58. The reactor of claim 54 wherein said side section further comprises an intermediate winding between said top and bottom windings, and wherein said top and bottom windings are grounded at the ends thereof and said RF power source is connected to said intermediate winding.

59. The reactor of claim 58 wherein said intermediate winding is half-way between said top and bottom windings whereby said inductor coil comprises a mirror-coil.

60. A plasma reactor, comprising:
 a reactor chamber including a multiple radius dome-shaped ceiling;
 a wafer pedestal for supporting a wafer inside said chamber for processing;
 means for introducing a processing gas into said chamber;
 an RF power source; and
 a conductor conforming with a three dimensional surface coupled to said RF power source and having a shape lying within a range of shapes, said range extending from and including a shape conformal with said dome-shaped ceiling to and including a right-cylindrical shape.

61. The plasma reactor of claim 60 wherein said RF power source comprises plural independent RF power supplies and said conductor comprises plural independent conductor sections separately connected to respective ones of said plural independent RF power supplies.

62. The plasma reactor of claim 60 wherein said conductor comprises multiple concentric spiral coils.

63. The plasma reactor of claim 60 wherein said conductor comprises plural oppositely wound inductive coil sections connected across said RF power source.

64. The reactor of claim 60 wherein said multiple radius dome ceiling has multiple radii determining a ceiling shape corresponding to a desired spatial distribution of plasma ion density.

65. The reactor of claim 60 wherein the shape of said conductor is such that said conductor includes a shallow top portion at least overlying said chamber and a steep bottom portion extending downwardly from said top portion.

66. The reactor of claim 60 wherein the shape of said conductor is at least partially a dome shape.

67. The reactor of claim 65 wherein said steep bottom portion is a truncated cone.

68. The reactor of claim 65 wherein said steep bottom portion is a cylinder.

69. The reactor of claim 65 wherein said steep bottom portion is dome-shaped.

70. An inductively coupled RF plasma reactor adapted to confine a subatmospheric processing gas environment for processing substrates, said reactor adapted for use with a first and second source of RF power, said reactor comprising:

a) a reactor chamber having a dome-shaped ceiling, said ceiling having a multi-radius dome shape with a minimum radius of curvature near a periphery of said ceiling and a maximum radius of curvature near an apex of said ceiling;

b) a pedestal centered within said chamber and ceiling to support a substrate for processing within said chamber;

c) a conductor defining a three dimensional surface supported adjacent and about said reactor chamber and adapted to be connected to said first source of RF power and to transmit said power inside the chamber to form a plasma from processing gases, said conductor being juxtaposed generally axially about said dome at one end thereof and generally radially inwardly at the other end thereof toward said apex;

d) whereby said dome and conductor configurations optimize the uniformity of plasma ion density across a substrate being processed.

71. The reactor of claim 70, in which said conductor includes respective radially distinct sections which may be separately supplied with RF power to vary the ratio of RF power as between said sections, to further optimize said uniformity across a substrate being processed.

72. The reactor of claim 70, in which said pedestal is adapted to be connected to said second RF power source, thereby allowing the power applied to said inductor and the power applied to said pedestal to be adjusted independently to improve the selection of desired etch rate and plasma bias.

73. The reactor of claim 70 wherein the generally axially extending shape of said conductor defines a cylindrical shape.

74. The reactor of claim 70 wherein the generally axially extending shape of said conductor defines a truncated conically shaped conductor.

75. The reactor of claim 70 wherein the generally axially extending shape of said conductor defines a curved shaped conductor section whose radius decreases from a position adjacent said one end toward said other end.

76. An RF plasma reactor for use with a source of RF power, and capable of confining a subatmospheric processing gas atmosphere for processing substrates, comprising:

a) a wafer pedestal for supporting a substrate within the reactor;

b) a reactor cover including a non-conductive multi-radius dome-shaped portion in facing spaced overlapping relationship to said pedestal;

c) said multi-radius dome shape having a minimum radius of curvature adjacent the periphery of said pedestal and a maximum radius of curvature adjacent the center of said pedestal; and d) a conductor defining a three dimensional surface supported about and adjacent said non-conductive cover portion, said conductor accepting power from a source of RF power and transmitting same into said reactor to sustain a plasma from gas within the reactor.

77. A reactor as in claim 76, in which for the greater part of the radius of said dome shaped cover portion, the radius of curvature is significantly closer to said maximum radius of curvature than to said minimum radius of curvature.

78. A reactor as in claim 76, in which said conductor is of a shape which differs from that of said multi-radius dome shape, with said shape being chosen to optimize plasma density uniformity across said pedestal.

79. A reactor as in claim 76, in which said conductor is of a shape, adjacent the periphery of said dome shaped cover portion, which has a radius of curvature greater than that of the adjacent sections of said dome shaped cover portion, but which, adjacent the center of said dome-shaped cover portion, becomes similar in radius of curvature to that of adjacent sections of said dome shaped cover portion.

80. A reactor as in claim 76, in which said conductor comprises a plurality of inductive coil windings each electrically parallel and each beginning and terminating at separate positions with respect to said dome-shaped cover portion.

81. A reactor as in claim 76, in which said conductor comprises a plurality of sections, with each section adapted to accept a different power level from other sections, as well as the same power level as the other sections.

82. A reactor as in claim 76 wherein said reactor further comprises a cylindrical side wall supporting said cover and said substrate is a discoid wafer conforming with a circumference of said wafer pedestal, said circumference being spaced from a co-planar portion of said side wall by a margin on the order of about ten centimeters.

83. A plasma reactor for processing substrates, comprising:

a) a wafer pedestal for supporting a substrate within the reactor;

b) a generally arcuately-shaped reactor cover of a non-conductive material supported in facing spaced overlapping relationship with the pedestal;

c) said cover approaching a flat shape over a substantial fraction of its diameter adjacent the center of the pedestal; and d) a conductor defining a three dimensional surface adjacent said cover and capable transmitting power into the reactor interior;

e) said conductor having at least one zone radially spaced from the center of said cover which is also spaced from said cover to a greater degree than other zones of said conductor;

f) whereby the shapes of said cover and inductor optimize the uniformity of plasma ion density across the pedestal.

84. A reactor as in claim 83 wherein said reactor further comprises a cylindrical side wall supporting said cover and said substrate is a discoid wafer conforming with a circumference of said wafer pedestal, said circumference being spaced from a co-planar portion of said side wall by a margin on the order of about ten centimeters.

85. An RF plasma reactor for use with a source of RF power, and accepting process gas for processing a work piece, said reactor comprising:

a pedestal capable of supporting a workpiece within the reactor;

a reactor chamber having a ceiling defining an interior surface over said pedestal in facing spaced relationship thereto, said ceiling facing said pedestal and including a central dielectric window, said interior surface having a multiradius shape including a maximum radius of curvature adjacent the center thereof and a minimum radius of curvature near the periphery thereof;

a coil of conductive material overlying said reactor chamber and being adapted to accept RF power from a source of RF power and inductively couple said RF power into said chamber via said window to maintain a plasma from process gas within the chamber.

86. The reactor of claim 85 wherein said coil is non-conformal with said interior surface of said ceiling.

87. The reactor of claim 86 wherein said coil is generally flat.

88. The reactor of claim 85 wherein said multi-radius shape of said interior surface is a flattened dome shape.

89. The reactor of claim 85 wherein said multi-radius shape of said interior surface includes a central flattened portion in facing relationship with said pedestal.

90. The reactor of claim 88 wherein said pedestal is coupled to RF power.

91. The reactor of claim 85 wherein said coil has a multi-radius dome shape.

92. The reactor of claim 91 wherein said multi-radius shape of said coil is a flattened dome shape.

93. The reactor of claim 91 wherein said coil is generally conformal with said shape of said interior surface of said ceiling.

94. The reactor of claim 85 wherein said ceiling has an exterior surface and said coil is conformal to said exterior surface of said ceiling.

95. The reactor of claim 85 wherein said ceiling has an exterior surface and the shape of said coil is non-conformal with the shape of said exterior surface of said ceiling.

96. The reactor of claim 85 wherein said interior surface of said ceiling is of a diameter greater than that of said pedestal.

97. The reactor of claim 92 wherein said exterior surface of said ceiling has a multi-radius shape.

98. The reactor of claim 97 wherein said interior and exterior surfaces of said ceiling and said coil have mutually conformal multi-radius dome shapes having maximum dome radii at their peripheries.

99. The reactor of claim 1 wherein said coil has a central aperture.

100. The reactor of claim 85 wherein said coil comprises a spiral conductor conforming with the shape of a surface.

101. The reactor of claim 100 wherein said surface is flat.

102. The reactor of claim 100 wherein said surface is dome shaped.

103. The reactor of claim 102 wherein said surface has a multi-radius dome shape having a maximum radius at the center of said ceiling.

104. An RF plasma reactor comprising:
a reactor chamber adapted to accept and confine process gases at subatmospheric pressures, said chamber having a roof including a dielectric portions, said chamber roof defining an interior surface;
a coil overlying said roof, and adapted to inductively couple RF power into said chamber to sustain a plasma of process gases within said chamber;
a pedestal inside said chamber supporting a workpiece to be processed in facing spaced relationship to said roof interior surface;
at least one of said roof interior surface and said coil having a flattened dome shape with a minimum radius of curvature near the periphery of said roof to shape plasma characteristics across the workpiece to be processed.

105. The reactor of claim 104 wherein said coil is non-conformal with said interior surface of said ceiling.

106. The reactor of claim 86 wherein said coil is generally flat.

107. The reactor of claim 106 wherein said roof interior surface has said flattened dome shape.

108. The reactor of claim 107 wherein said roof interior surface includes a central flattened portion in facing relationship with said pedestal.

109. The reactor of claim 104 wherein said pedestal is coupled to RF power.

110. The reactor of claim 104 wherein said coil has said flattened dome shape.

111. The reactor of claim 110 wherein said coil and said roof interior surface are generally conformal with one another.

112. The reactor of claim 104 wherein said roof has an exterior surface and said coil is conformal to said exterior surface of said roof.

113. The reactor of claim 104 wherein said roof has an exterior surface and the shape of said coil is non-conformal with the shape of said exterior surface of said roof.

114. The reactor of claim 104 wherein said interior surface of said ceiling is of a diameter greater than that of said pedestal.

115. The reactor of claim 112 wherein said interior and exterior surfaces of said ceiling and said coil have mutually conformal multi-radius dome shapes having maximum dome radii at their peripheries.

116. The reactor of claim 110 wherein said coil has a central aperture.

117. The reactor of claim 110 wherein said coil comprises a spiral conductor conforming with the shape of a surface.

118. The reactor of claim 117 wherein said surface is flat.

119. The reactor of claim 117 wherein said surface is dome shaped.

120. The reactor of claim 119 wherein said surface has a multi-radius dome shape having a maximum radius at the center of said roof.

121. The reactor of claim 101 wherein said coil overlies said dielectric portion of said roof.

* * * * *